(12) United States Patent
Ishikawa et al.

(10) Patent No.: US 8,097,301 B2
(45) Date of Patent: Jan. 17, 2012

(54) ELECTRICAL INSULATION FILM MANUFACTURING METHOD

(75) Inventors: Tetsushi Ishikawa, Akishima (JP); Osamu Nakamura, Kodaira (JP)

(73) Assignee: Casio Computer Co., Ltd., Tokyo (JP)

( * ) Notice: Subject to any disclaimer, the term of this patent is extended or adjusted under 35 U.S.C. 154(b) by 724 days.

(21) Appl. No.: 11/893,277

(22) Filed: Aug. 15, 2007

(65) Prior Publication Data

US 2008/0057196 A1    Mar. 6, 2008

(30) Foreign Application Priority Data

| Aug. 30, 2006 | (JP) | ................................. 2006-233849 |
| Sep. 29, 2006 | (JP) | ................................. 2006-267832 |
| May 21, 2007 | (JP) | ................................. 2007-133587 |

(51) Int. Cl.
*C23C 16/40*     (2006.01)

(52) U.S. Cl. ................ 427/255.31; 427/295; 427/376.2; 427/376.4

(58) Field of Classification Search ............. 427/255.29, 427/255.31, 295, 255.26, 255.7
See application file for complete search history.

(56) References Cited

U.S. PATENT DOCUMENTS

| 5,731,270 | A | * | 3/1998 | Setsune et al. ................ 505/320 |
| 5,964,965 | A | * | 10/1999 | Schulz et al. ................ 148/420 |
| 6,281,626 | B1 | * | 8/2001 | Nakamura et al. ............ 313/491 |
| 6,506,265 | B2 | * | 1/2003 | Yamamoto et al. ........... 148/302 |
| 6,749,686 | B2 |  | 6/2004 | Ami et al. |
| 6,964,826 | B2 | * | 11/2005 | Ovshinsky et al. ............ 502/335 |
| 7,135,699 | B1 | * | 11/2006 | Atanackovic .................. 257/22 |
| 2002/0119659 | A1 |  | 8/2002 | Ami et al. |
| 2005/0170946 | A1 | * | 8/2005 | Ovshinsky et al. ............ 502/60 |
| 2006/0258538 | A1 | * | 11/2006 | Yasuo et al. .................. 505/100 |
| 2007/0089806 | A1 | * | 4/2007 | Blank et al. .................... 148/105 |
| 2008/0078444 | A1 | * | 4/2008 | Atanackovic ................. 136/256 |

FOREIGN PATENT DOCUMENTS

| JP | 10-020819 A | 1/1998 |
| JP | 10-269986 A | 10/1998 |
| JP | 2000-281494 A | 10/2000 |
| JP | 2004-063131 A | 2/2004 |
| JP | 2004-256387 A | 9/2004 |
| JP | 2004-283749 A | 10/2004 |
| JP | 4254823 B2 | 4/2009 |
| KR | 2000-0062364 A | 10/2000 |

OTHER PUBLICATIONS

Zhang, Yang-huan, et al., "The hydrogenation and dehydrogenation behaviours of Mg20-xLaxNi10(x=0-6) alloys prepared by casting and rapid quenching". Journal of Alloys and Compounds 476 (2009) pp. 457-461.*
Aruna, I., et al., "Gadolinium Nanoparticle Based Switchable Mirrors: Quenching of Hydrogenation-Dehydrogenation Hysteresis". Journal of Nanoscience and Nanotechnology, vol. 7, pp. 1768-1774, 2007.*
Senoh, Hirsohi, et al., "Hydrogenation and Dehydrogenation Properties of RhNi5 (Rh—Heavy Rare Earth) Binary Intermetallic Compounds". Materials Transactions, vol. 45, No. 02 (2004) pp. 292-295. Abstract Only.*
Japanese Office Action (and English translation thereof) dated Oct. 7, 2008, issued in counterpart Japanese Application No. 2006-267832.
Japanese Office Action (and English translation thereof) dated Oct. 7, 2008, issued in counterpart Japanese Application No. 2006-233849.
Japanese Office Action dated Apr. 28, 2009 (3 pages), and English translation thereof (5 pages), issued in counterpart Japanese Application Serial No. 2007-133587.
Basiev, T. T., et al "Hydration of Strontium Chloride and Rare-Earth Element Oxychlorides", Inorganice Synthesis and Industrial Inorganic Chemistry, Russian Journal of Applied Chemistry, vol. 78, No. 7, pp. 1035-1037.
Korean Office Action (and English translation thereof) dated Jul. 24, 2008, issued in a counterpart Korean Application.
Korean Office Action dated Apr. 9, 2009 (6 pages), and English translation thereof (4 pages), issued in counterpart Korean Application Serial No. 10-2007-0083183.

* cited by examiner

*Primary Examiner* — Bret Chen
(74) *Attorney, Agent, or Firm* — Holtz, Holtz, Goodman & Chick PC

(57) ABSTRACT

A method of manufacturing an electrical insulation film includes (i) forming an R film containing at least one rare earth element R selected from the group including Sc, Y, La, Gd, Dy, Ho, Er, Tm, and Lu on at least a portion of a surface of a metal substrate where an electrical insulation property is needed, (ii) hydrogenating the R film under an inert gas atmosphere, which contains a hydrogen gas, to form an $RH_2$ film; and (iii) oxidizing the $RH_2$ film to form an $R_2O_3$ film.

8 Claims, 24 Drawing Sheets

FIG. 32

| NAME OF MATERIAL | | LINEAR EXPANSION COEFFICIENT ($\times 10^{-6}/°C$) |
|---|---|---|
| $SiO_2$ (AMORPHOUS) | | 0.5-0.6 |
| CRYSTAL($\alpha$-QUARTZ) | a AXIS | 6.8-9.0 |
| | c AXIS | 12.0-14.0 |
| $Y_2O_3$ (CRYSTALLIZED) | | 7.2 |
| $Gd_2O_3$ (CRYSTALLIZED) | | 10 |
| Ni | | 12.7 |
| Ni-Cr ALLOY | | 13.5 |
| INCONEL600 (Ni ALLOY) | | 13.8 |
| INCONEL783 (Ni ALLOY) | | 10.2 |

FIG. 33

| RARE EARTH ELEMENT | RARE EARTH OXIDE |
|---|---|
| Sc | $Sc_2O_3$ |
| Y | $Y_2O_3$ |
| La | $La_2O_3$ |
| Ce | $CeO, Ce_2O_3, CeO_2$ |
| Pr | $Pr_6O_{11}$ |
| Nd | $Nd_2O_3$ |
| Sm | $SmO, Sm_2O_3$ |
| Eu | $EuO, Eu_2O_3$ |
| Gd | $Gd_2O_3$ |
| Tb | $Tb_2O_3, TbO_2$ |
| Dy | $Dy_2O_3$ |
| Ho | $Ho_2O_3$ |
| Er | $Er_2O_3$ |
| Tm | $Tm_2O_3$ |
| Yb | $Yb, Yb_2O_3$ |
| Lu | $Lu_2O_3$ |

FIG. 34

| RARE EARTH OXIDE | MELTING POINT (°C) | CRYSTAL STRUCTURE |
|---|---|---|
| $Sc_2O_3$ | 2300 | C TYPE |
| $Y_2O_3$ | 2410 | C TYPE |
| $La_2O_3$ | 2250 | A TYPE |
| $Gd_2O_3$ | 2340 | B TYPE, C TYPE |
| $Dy_2O_3$ | 2340 | C TYPE |
| $Ho_2O_3$ | APPROXIMATELY 2300 | C TYPE |
| $Er_2O_3$ | APPROXIMATELY 2300 | C TYPE |
| $Tm_2O_3$ | APPROXIMATELY 2300 | C TYPE |
| $Lu_2O_3$ | APPROXIMATELY 2300 | C TYPE |

ELECTRICAL INSULATION FILM MANUFACTURING METHOD

BACKGROUND OF THE INVENTION

1. Field of the Invention

The present invention relates to a method of manufacturing an insulation film, a reaction device equipped with the insulation film, a power generation device, and an electronic apparatus.

2. Related Art

In recent years, awareness for miniaturization and weight reduction of an electronic apparatus, such as a laptop computer, a cellular phone, a digital camera, or the like, have increased, and the miniaturization of the parts that are mounted in the apparatus has been required. A Micro Electro Mechanical Systems (MEMS) technique is known as a technique of producing a micro device, such as a sensor, a pump, an actuator, a motor, and a chemical reactor that are all small sized, by utilizing a silicon wafer processing technique which has been accumulated by development of semiconductor devices. For example, in the field of a reforming type fuel cell, the MEMS technique is used for a small-sized reforming type reaction device which is called a micro reactor module, in which a vaporizer, a reformer, and a carbon monoxide remover are stacked.

Each reactor (micro reactor) of the micro reactor module is constructed by forming minute grooves on substrates and then joining the substrates, on which the grooves are formed, together. The grooves are used as flow paths. Moreover, a catalyst for accelerating reactions is provided in each of the reaction flow paths. FIGS. 31A and 31B are views showing the case where the substrate is a glass substrate, and a thin-film heater combined with temperature sensor 405 and an insulation protecting layer 406 are formed on the substrate 400. FIG. 31A is a plan view of the substrate 400, and FIG. 31B is a sectional view seen from the direction indicated by the arrow with respect to the cutting plane line XXXI-XXXI of FIG. 31A. As shown in FIG. 31B, the thin-film heater combined with temperature sensor 405 composed of an adhering layer 401, a diffusion preventing layer 402, a heating resistor layer 403, and a diffusion preventing layer 404; and the insulation protecting layer 406 are formed on the surface of the substrate 400. Here, flow paths are not shown for the convenience of the drawings. The thin-film heater combined with temperature sensor bears the role of controlling the temperature of the substrate to be in a desired range, such as 280° C. to 400° C. in a steam reformer, and 100° C. to 180° C. in a carbon monoxide remover, and the role of sensing the temperature.

In a case where metal is used as the substrate, since the metal has high thermal conductivity and a small heat capacity, heat conduction from the thin-film heater, which serves as a heating element, to a supported catalyst can proceed quickly, and this provides the metal substrate an advantage of realizing effective heat utilization and high speed starting. As a metal micro reactor, one that is prepared by forming a metal oxide film by anodizing the metal substrate itself, the substrate composed of Al, Cu, stainless, or the like, and then forming a heating element on the metal oxide film, has been known (see, for example, Japanese Patent Application Laid-Open Publication No. 2004-256387). Moreover, materials capable of being anodized, such as Si, Ta, Nb, V, Bi, Y, W, Mo, Zr, and Hf, have been used as object substrates besides the metal substrate.

As mentioned above, in a case where the micro reactor is produced by using the metal substrate, since both of the substrate and the thin-film heater (combined with the temperature sensor) have electric conductivity, and a voltage is applied to the thin-film heater (combined with the temperature sensor), an insulation film is required between the metal substrate and the thin-film heater (combined with the temperature sensor). In the case of the metal micro reactor described in Japanese Patent Application Laid-Open Publication No. 2004-256387, an insulation film is provided by anodizing the substrate itself to produce an insulation film having a film thickness of 5 µm to 150 µm. However, the insulation film formed by the anodization frequently has microscopic pores, and therefore it is not expected that the insulation film has a high withstand voltage. Moreover, since the film thickness of the insulation film is thick so as to be in a range of 5 µm to 150 µm, the metal substrate also becomes thick, and thus there is a problem that the metal micro reactor is unsuitable for high speed starting, when the increase of the heat capacity of the reactor due to the thickness of the metal substrate is taken into consideration. Furthermore, since the micro reactor is operated under a high temperature environment, there is also a limitation with respect to the substrate that can be selected: a metal having a high heat resisting property (such as Ni, a Ni—Cr alloy, and an alloy including Ni such as Inconel™) must be used. Here, among rare earth elements, only Y has been cited as the object substrate.

On the other hand, in a case where a $SiO_2$ film, which is known as a material with high withstand voltage, is formed on a metal substrate by a vapor deposition method, a sputtering method, a chemical vapor deposition (CVD) method, a coating method, or the like, the formed $SiO_2$ film generally has an amorphous structure. As shown in FIG. 32, the $SiO_2$ of the amorphous structure has a linear expansion coefficient in a range of 0.5 to 0.6 ($\times 10^{-6}$/° C.), and thus is smaller than the linear expansion coefficient of a metal, which is within a range of 10 to 14 ($\times 10^{-6}$/° C.), by two digits. Such a discrepancy between the heat expansion coefficient of the substrate and that of the film in a micro reactor, which is used under an environment higher than a room temperature, causes crack and peel-off of the insulation film when the substrate is distorted by heat, resulting in low reliability of the electrical insulation between the metal substrate and the thin-film heater (combined with the temperature sensor). Consequently, use of the $SiO_2$ film is not preferable. In a case where high speed starting is aimed, the aforementioned problem occurs especially easily. The problem is faced not only by small reactors but is common to all the devices operating at high temperatures, such as a solid oxide fuel cell which is operated at a high temperature within a range of 600° C. to 900° C.

Here, as shown in FIG. 32, a crystal (α-quartz), which is crystallized $SiO_2$, has linear expansion coefficients within a range of 6 to 9 ($\times 10^{-6}$/° C.) in the a-axis direction, and within a range of 12 to 14 ($\times 10^{-6}$/° C.) in the c-axis direction. As described above, even with the same material, linear expansion coefficients of an amorphous material and crystal material differ from each other by one digit or more. Consequently, it can be said that a crystal insulation film is suitable to be formed on a metal substrate which has a comparatively large linear expansion coefficient. However, the $SiO_2$ film, which is a typical insulation film formed by the vapor deposition method, the sputtering method, the CVD method, the coating method, or the like, generally has an amorphous structure, and is difficult to be crystallized by an easy method such as a anneal process.

On the other hand, it is known that $YO_x$ is used as an electron emitting film of a cold cathode (see, for example, Japanese Patent Application Laid-Open Publication No.

10-269986). The crystal of $YO_x$ depends on the oxygen concentration during the oxidizing process, and five types of films are prepared. Among them, a $YO_x$ (1.32>X≧0.95) film including NaCl type is said to be suitable as the electron emitting film of the cold cathode. The method of producing a $YO_x$ film performs the steps of: forming an Y metal film on a substrate (here, the substrate includes Ni and Cr), which has been subjected to a washing process, by the vapor deposition method or the sputtering method, and then performing the oxidizing process. Subsequently, in a case where the film is a crystallite or amorphous, an anneal process is separately performed.

However, the $YO_x$ film prepared in accordance with the description of Japanese Patent Application Laid-Open Publication No. 10-269986 has an X value in a range of 1.32>X≧0.95, which is shifted from the stoichiometric value, and behaves as a good conductor with respect to an electrical property. Consequently, the $YO_x$ film has a problem that it cannot be used as an interlayer insulation film.

Accordingly, the present invention has been made in view of the circumstances mentioned above, and an object is to provide a method of manufacturing an insulation film capable of increasing the reliability of electrical isolation; and a reaction device, a power generation device, and an electronic apparatus that are equipped with the insulation film.

SUMMARY OF THE INVENTION

According to a first aspect of the present invention, there is provided a method of manufacturing an insulation film, comprising:
an R film forming step to form an R film containing at least one rare earth element R selected from the group consisting of Sc, Y, La, Gd, Dy, Ho, Er, Tm, and Lu on at least a portion of a surface of a metal substrate where an insulation property is needed;
a hydrogenating step to hydrogenate the R film under an inert gas atmosphere, which contains a hydrogen gas, to form an $RH_2$ film; and
an oxidizing step to oxidize the $RH_2$ film to form an $R_2O_3$ film.

According to a second aspect of the present invention, there is provided a method of manufacturing an insulation film, comprising:
a vapor deposition step to deposit a vapor deposition source to at least a portion of a surface of a metal substrate where an insulation property is needed, the vapor deposition source including hydrogen atom and at least one rare earth element R selected from the group consisting of Sc, Y, La, Gd, Dy, Ho, Er, Tm, and Lu; and
an oxidizing step to oxidize the metal substrate after vapor deposition to form an $R_2O_3$ film.

According to a third aspect of the present invention, there is provided a method of manufacturing an insulation film, comprising:
a first $R_2O_3$ film forming step to form a first $R_2O_3$ film containing at least one rare earth element R selected from the group consisting of Sc, Y, La, Gd, Dy, Ho, Er, Tm, and Lu on at least a portion of a surface of a metal substrate where an insulation property is needed; and
a second $R_2O_3$ film forming step including:
an R film forming step to form an R film containing at least one rare earth element R selected from the group consisting of Sc, Y, La, Gd, Dy, Ho, Er, Tm, and Lu on the first $R_2O_3$ film,
a hydrogenating step to hydrogenate the R film under an inert gas atmosphere, which contains a hydrogen gas, to form an $RH_2$ film, and
an oxidizing step to oxidize the $RH_2$ film.

According to a fourth aspect of the present invention, there is provided a method of manufacturing an insulation film, comprising:
a first $R_2O_3$ film forming step including:
an R film forming step to form an R film containing at least one rare earth element R selected from the group consisting of Sc, Y, La, Gd, Dy, Ho, Er, Tm, and Lu on at least a portion of a surface of a metal substrate where an insulation property is needed,
a hydrogenating step to hydrogenate the R film under an inert gas atmosphere, which contains a gas including hydrogen atom, to form an $RH_2$ film, and
an oxidizing step to oxidize the $RH_2$ film; and
a second $R_2O_3$ film forming step to form a second $R_2O_3$ film containing at least one rare earth element R selected from the group consisting of Sc, Y, La, Gd, Dy, Ho, Er, Tm, and Lu on the first $R_2O_3$ film.

According to a fifth aspect of the present invention, there is provided a method of manufacturing an insulation film, comprising:
a first $R_2O_3$ film forming step to form a first $R_2O_3$ film containing at least one rare earth element R selected from the group consisting of Sc, Y, La, Gd, Dy, Ho, Er, Tm, and Lu on at least a portion of a surface of a metal substrate where an insulation property is needed; and
a second $R_2O_3$ film forming step including:
a vapor deposition step to deposit a vapor deposition source on the first $R_2O_3$ film, the vapor deposition source including hydrogen and at least one rare earth element R selected from the group consisting of Sc, Y, La, Gd, Dy, Ho, Er, Tm, and Lu, and
an oxidizing step to oxidize the metal substrate after the vapor deposition.

According to a sixth aspect of the present invention, there is provided a method of manufacturing an insulation film, comprising:
a first $R_2O_3$ film forming step including:
a vapor deposition step to deposit a vapor deposition source to at least a portion of a surface of a metal substrate where an insulation property is needed, the vapor deposition source including hydrogen and at least one rare earth element R selected from the group consisting of Sc, Y, La, Gd, Dy, Ho, Er, Tm, and Lu, and
an oxidizing step to oxidize the metal substrate after the vapor deposition; and
a second $R_2O_3$ film forming step to form a second $R_2O_3$ film containing at least one rare earth element R selected from the group consisting of Sc, Y, La, Gd, Dy, Ho, Er, Tm, and Lu on the first $R_2O_3$ film.

According to a seventh aspect of the present invention, there is provided a reaction device comprising:
a metal substrate; and
an $R_2O_3$ film having a crystal structure structured with at least one rare earth element R selected from the group consisting of Sc, Y, La, Gd, Dy, Ho, Er, Tm, and Lu, the $R_2O_3$ film being formed on at least a portion of a surface of the metal substrate where an insulation property is needed.

According to an eighth aspect of the present invention, there is provided a reaction device comprising:
a metal substrate;
a first $R_2O_3$ film formed on at least a portion of a surface of the metal substrate where an insulation property is needed, the first $R_2O_3$ film containing at least one rare earth element R selected from the group consisting of Sc, Y, La, Gd, Dy, Ho, Er, Tm, and Lu; and a second $R_2O_3$ film formed by a manufacturing method including:

an R film forming step to form a R film containing at least one rare earth element R selected from the group consisting of Sc, Y, La, Gd, Dy, Ho, Er, Tm, and Lu on the first $R_2O_3$ film, a hydrogenating step to hydrogenate the R film under an inert gas atmosphere, which contains a gas including hydrogen atom, to form an $RH_2$ film, and an oxidizing step to oxidize the $RH_2$ film.

According to a ninth aspect of the present invention, there is provided a reaction device comprising:

a metal substrate;

a first $R_2O_3$ film formed by a manufacturing method including:

an R film forming step to form an R film on at least a portion of a surface of the metal substrate where an insulation property is needed, the R film containing at least one rare earth element R selected from the group consisting of Sc, Y, La, Gd, Dy, Ho, Er, Tm, and Lu, a hydrogenating step to hydrogenate the R film under an inert gas atmosphere, which contains a gas including hydrogen atom, to form an $RH_2$ film, and an oxidizing step to oxidize the $RH_2$ film; and a second $R_2O_3$ film formed on the first $R_2O_3$ film, a second $R_2O_3$ film containing at least one rare earth element R selected from the group consisting of Sc, Y, La, Gd, Dy, Ho, Er, Tm, and Lu.

According to a tenth aspect of the present invention, there is provided a reaction device comprising:

a metal substrate;

a first $R_2O_3$ film formed on at least a portion of a surface of the metal substrate where an insulation property is needed, the first $R_2O_3$ film containing at least one rare earth element R selected from the group consisting of Sc, Y, La, Gd, Dy, Ho, Er, Tm, and Lu; and a second $R_2O_3$ film formed by a manufacturing method including:

a vapor deposition step to deposit a vapor deposition source on the first $R_2O_3$ film, the vapor deposition source including hydrogen and the at least one rare earth element R selected from the group consisting of Sc, Y, La, Gd, Dy, Ho, Er, Tm, and Lu, and an oxidizing step to oxidize the metal substrate after the vapor deposition.

According to an eleventh aspect of the present invention, there is provided a reaction device comprising:

a metal substrate;

a first $R_2O_3$ film formed on at least a portion of a surface of the metal substrate where an insulation property is needed, the first $R_2O_3$ film formed by a manufacturing method including:

a vapor deposition step to deposit a vapor deposition source to the portion, the vapor deposition source including hydrogen and at least one rare earth element R selected from the group consisting of Sc, Y, La, Gd, Dy, Ho, Er, Tm, and Lu, and an oxidizing step to oxidize the metal substrate after the vapor deposition; and a second $R_2O_3$ film formed on the first $R_2O_3$ film, the second $R_2O_3$ film containing at least one rare earth element R selected from the group consisting of Sc, Y, La, Gd, Dy, Ho, Er, Tm, and Lu.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein;

FIG. 32 is a list of linear expansion coefficients;

FIG. 33 is a list of rare earth elements and rare earth oxides made from them; and FIG. 34 is a list of the melting points and the crystal structures of rare earth oxides.

DETAILED DESCRIPTION OF THE PREFERRED EMBODIMENTS

In the following, the best modes of implementing the present invention will be described with reference to the attached drawings. Although the embodiments described below include various technically preferable limitations for implementing the present invention, the scope of the invention is not limited to the following embodiments and shown examples.

First Embodiment

Figure 1:
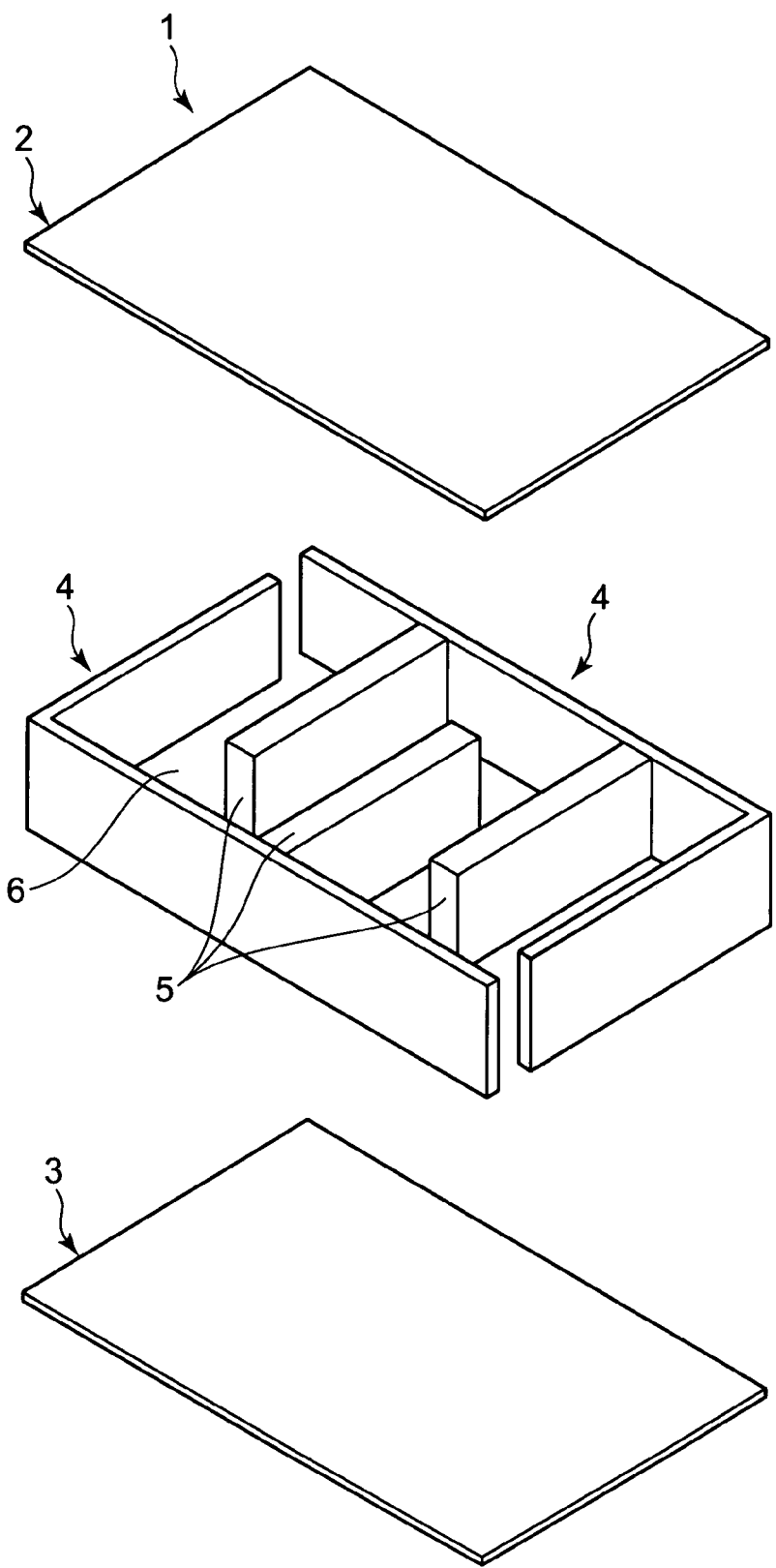
FIG. 1 is an exploded perspective view of a micro reactor 1.

FIG. 1 is an exploded perspective view of a micro reactor 1 of an embodiment of the reaction device according to the present invention.

The micro reactor 1 is built in electronic apparatus such as a laptop computer, a personal digital assistant (PDA), an electronic organizer, a digital camera, a cellular phone, a wrist watch, a register, and a projector, and the micro reactor 1 is a reaction device that produces hydrogen gas to be used by a fuel cell (generator cell).

The micro reactor 1 is composed of a rectangular thin plate-like top plate 2, a rectangular thin plate-like base plate 3, frame bodies 4, 4, which are severally shaped in a letter L at the time of being seen from an upper position to be provided to stand between the top plate 2 and the base plate 3 perpendicularly to the under surface of the top plate 2 and the top surface of the base plate 3, and three partition walls 5, 5, . . . as an example of thin plates provided in the frame bodies 4, 4 perpendicularly to the internal wall surfaces in the lengthwise directions of the frame bodies 4, 4. The inside of the frame bodies 4, 4 is partitioned to a winding flow path 6 by the three partition walls 5, 5, . . . . The heights of the partition walls 5, 5, . . . are almost the same as those of the circumjacent frame bodies 4, 4. Moreover, gaps (inflow port, outflow port) are formed between both ends of the frame bodies 4, 4 to lead to the flow path 6.

Any of the top plate 2, the base plate 3, the frame bodies 4, 4, and the partition walls 5, 5, . . . are made of a metal material having a good heat resisting property, such as Ni, Ni—Cr alloy, and an alloy including Ni such as Inconel™. The base plate 3, the frame bodies 4, 4, the partition walls 5, 5, . . . , and the top plate 2 are joined together by brazing. Moreover, a catalyst is carried on the top surface of the base plate 3, the under surface of the top plate 2, the internal surfaces of the frame bodies 4, 4, and both side walls of the partition walls 5, 5, . . . , which constitute the flow path 6 of the micro reactor 1. As the catalyst, at least one kind of metal species or at least one kind of metal oxide is preferably included, and a platinum catalyst, Cu/ZnO series catalysts, Pd/ZnO series catalysts, and the like, can concretely be cited.

Figure 2A:
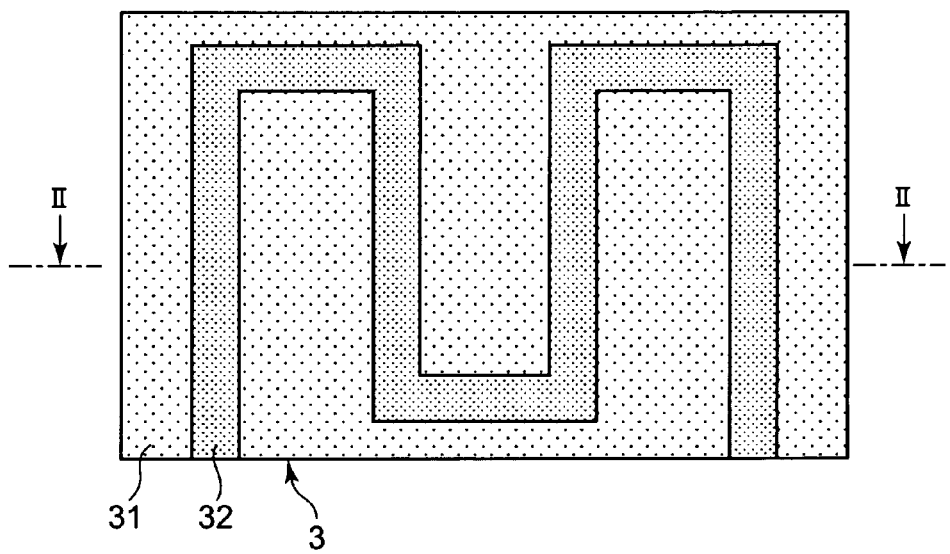
FIG. 2A is a bottom view of a base plate 3.
Figure 2B:
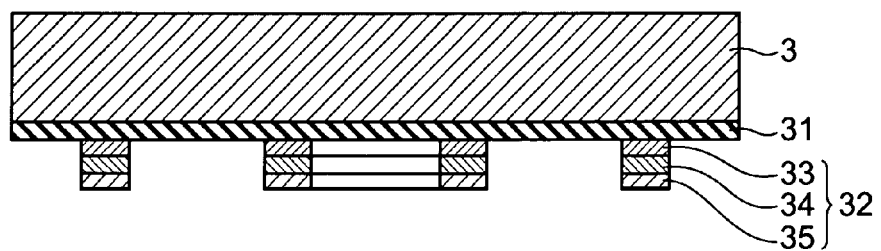
FIG. 2B is a sectional view of a cutting plane line II-II in FIG. 2A seen from the direction indicated by an arrow.

FIG. 2A is the bottom view of the base plate 3, and FIG. 2B is a sectional view seen from the arrow direction of a cutting plane line II-II in FIG. 2A (the configuration on the flow path side of the base plate 3 is omitted to be shown for making the drawing easy to understand).

On the under surface of the base plate 3, an insulation film 31 is formed on the whole surface. The insulation film 31 is an $R_2O_3$ film (R indicates a rare earth element), such as $Y_2O_3$ and $Gd_2O_3$ films, having a crystal structure. The crystal structure is the C type (bixbyite structure) (the details of the crystal structure will be described later). Because atoms can be more densely packed by having the crystal, structure than those of the case of being amorphous, the expansion of the insulation film 31 owing to heat becomes larger, and as a result, the linear expansion coefficient thereof becomes higher to be $7.2 \times 10^{-6}$/° C. ($Y_2O_3$ film) or $10 \times 10^{-6}$/° C. ($Gd_2O_3$ film). The linear expansion coefficient is consequently nearer to the linear expansion coefficient of the base plate 3, which is a metal substrate, and it is preferable. The film formation of the $R_2O_3$ film having the bixbyite structure can be performed by a sputtering method using $R_2O_3$ as a target material. Moreover, in order to promote the crystallization of the film, it is preferable to perform annealing of the film in an air atmosphere or in an inert gas after the film formation. The method of the film formation is not limited to the sputtering method, but may be the vapor deposition method, the CVD method, an ion plating method, the coating method, and the like. The film thickness of the metal substrate is 0.5 mm or less, and the film thickness of the insulation film 31 is preferably within a range of about 200 nm to about 600 nm owing to the relation with the substrate thickness of the metal substrate.

A thin-film, heater 32 is patterned on the surface of the insulation film 31 in a state of meandering by a photolithographic technique. The thin-film heater 32 is formed by laminating a metal-stuck layer (an adhering layer) 33, a diffusion preventing layer 34, and a heating resistor layer 35 in order from the side of the insulation film 31. The heating resistor layer 35 is made of a material (such as Au) having the lowest resistivity among those of the three layers, and a current intensively flows through the heating resistor layer 35 to produce heat when a voltage is applied to the thin-film heater 32. The material of the diffusion preventing layer 34 preferably is the one which the material of the heating resistor layer 35 doesn't diffuse easily to the diffusion preventing layer 34 by heat, and which the material of the diffusion preventing layer 35 doesn't also diffuse easily to the heating resistor layer 35 by heat, when the thin-film heater 32 produces heat. Accordingly, a material (such as W) having a comparatively high melting point and a comparatively low reactivity is preferably used as the materials of the diffusion preventing layer 34. Moreover, the metal-stuck layer 33 is provided for preventing the diffusion preventing layer 34 having a low adhesion property to the insulation film 31 from peel-off from the insulation film 31, and is formed of a material (such as Ta, Mo, Ti, or Cr) having an excellent adhesion property to the diffusion preventing layer 34 and the insulation film 31. The film thickness of the metal-stuck layer 33 is preferably within a range of 100 nm to 200 nm; the film thickness of the diffusion preventing layer 34 is preferably within a range of 50 nm to 100 nm; and the film thickness of the heating resistor layer 35 is preferably within a range of 200 nm to 400 nm. The thin-film heater 32 heats the micro reactor 1 at the time of starting. Because the electric resistance of the thin-film heater 32 changes dependently to the temperature thereof, the thin-film heater 32 functions as a temperature sensor reading a change of the temperature based on a change of the resistance value thereof. To put it concretely, as the temperature sensor, the thin-film heater 32 uses its region of the electric resistance where the electric resistance linearly changes to the temperature.

In the micro reactor 1 having the aforesaid configuration, a voltage is applied to a lead wire (not shown) connected to the thin-film heater 32 to make the thin-film heater 32 produce heat, and thereby the micro reactor 1 is heated. Then, a reactant is sent into the flow path 6, and the reactant reacts while it is flowing through the flow path 6.

Figure 3A:
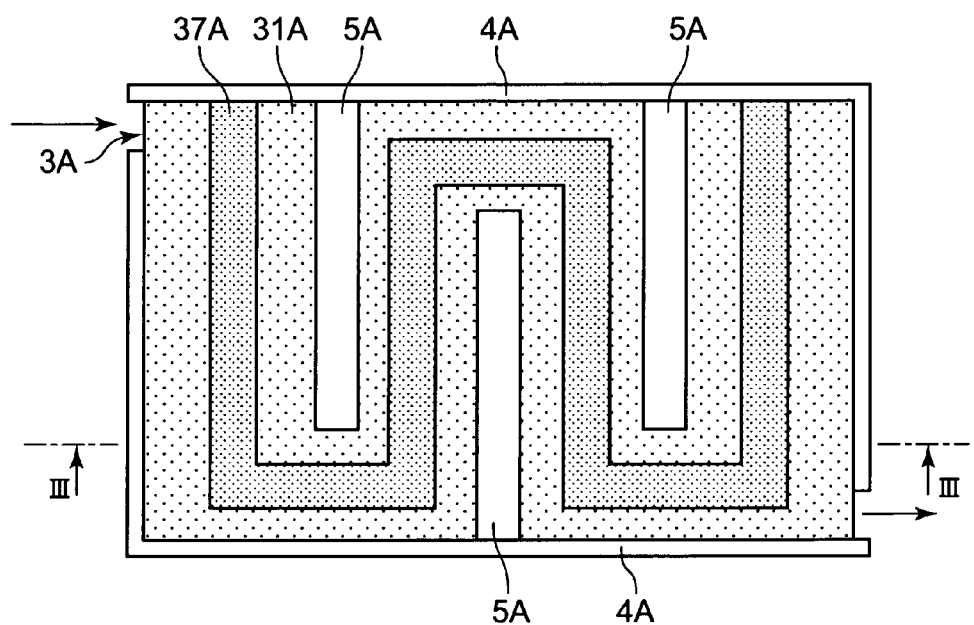
FIG. 3A is a view showing a modification of a base plate 3A, the base plate 3A being joined with frame bodies 4A, 4A and being seen from top.
Figure 3B:
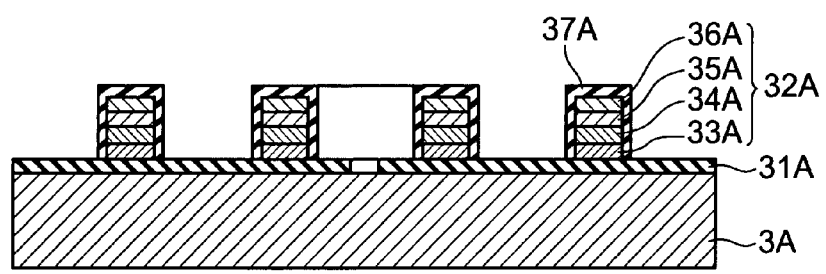
FIG. 3B is a sectional view of a cutting plane line III-III in FIG. 3A seen from the direction indicated by an arrow.

FIGS. 3A and 3B show a modification of the base plate 3A. FIG. 3A is a top view showing the state of joining the frame bodies 4A, 4A on the base plate 3A, and FIG. 3B is a sectional view seen from the arrow direction of a cutting plane line III-III in FIG. 3A (the detailed configuration of the lid surface on the flow path side is omitted to be shown for easy understanding).

As shown in FIG. 3A, an insulation film 31A is formed on the region of the top surface of the base plate 3A except for the regions of partition walls 5A, 5A, in the state of meandering. The configuration of arranging the thin-film heater on the same side as that of the flow path may be adopted, but it is needed to form an insulation protecting layer for securing the insulation property from the catalyst as shown in FIG. 3B. A thin-film heater 32A composed of four layers (the metal-stuck layer (adhering layer) 33A, the diffusion preventing layer 34A, the heating resistor layer 35A, and a diffusion preventing layer 36A) is patterned on the insulation film 31A in the state of meandering, and an insulation protecting layer 37A is formed on the thin-film heater 32A. An $R_2O_3$ film is desirable as the insulation protecting layer 37A, a $SiO_2$ film may be used if the film thickness thereof is thin.

As described above, the $R_2O_3$ film, which is the insulation film 31 and has a crystal structure (bixbyite structure), intervenes between the base plate 3, which is a metal substrate, and the thin-film heater 32 formed on the substrate. Because the $R_2O_3$ film has a heat expansion coefficient that is very near to that of a metal, the difference between the heat expansion coefficient of the $R_2O_3$ film and that of the base plate 3, which is a metal substrate, can be made to be small. As a result, the cracks and the peel-off of the insulation film 31, which easily arise when the metal substrate is distorted in a temperature environment higher than a room temperature, can be prevented, and the reliability of the insulation film 31 can be raised. Moreover, the $R_2O_3$ film has crystallinity even immediately after film formation, and a crystallized film can easily be obtained. Moreover, because the $R_2O_3$ film has a high melting point (see FIG. 34, which will be described later), the film can endure in a high temperature environment. Moreover, because the $R_2O_3$ film can be annealed in an inert gas, the $R_2O_3$ film is not exposed to the air at the time of the film formation thereof on the metal substrate of the base plate 3. Consequently, the oxidization of the metal substrate can be prevented. Furthermore, because the $R_2O_3$ film is difficult to be reduced, the $R_2O_3$ film is difficult to receive oxygen deficiency. Consequently, the insulation property of the $R_2O_3$ film does not deteriorate, and the $R_2O_3$ film can suitably be used as the insulation film 31.

Now, in FIGS. 2A and 2B, two new manufacturing methods of an $Y_2O_3$ film in the case where Y is used as the rare earth element R of the $R_2O_3$ film, which is the insulation film 31 having the bixbyite structure, are described.

<First Manufacturing Method>

First, an Y film is formed on the under surface of a metal substrate (base plate 3) by the sputtering method. After that, the formed Y film is annealed at a temperature within a range of 300° C. to 400° C. for 15 minutes in an atmosphere including 4% or less by weight of hydrogen gas and the residual weight of inert gas (Ar, Ne, or $N_2$ gas) to form an $YH_2$ film. Furthermore, the $YH_2$ film is annealed at a temperature within a range of 520° C. to 800° C. for 30 minutes in a vacuum atmosphere ($1 \times 10^{-4}$ Pa) to perform film formation. Incidentally, an Y ingot including no hydrogen atom is used as a sample of sputtering. Moreover, the film formation method of the Y film is not limited to the sputtering method, but the vapor deposition method, the CVD method, the ion plating method, the coating method, and the like, may be adopted. The film thickness of the metal substrate is 0.5 mm or less, and the film thickness of the insulation film 31 is preferably within a range of 200 nm to 600 nm owing to the relation with the substrate thickness.

Figure 4:
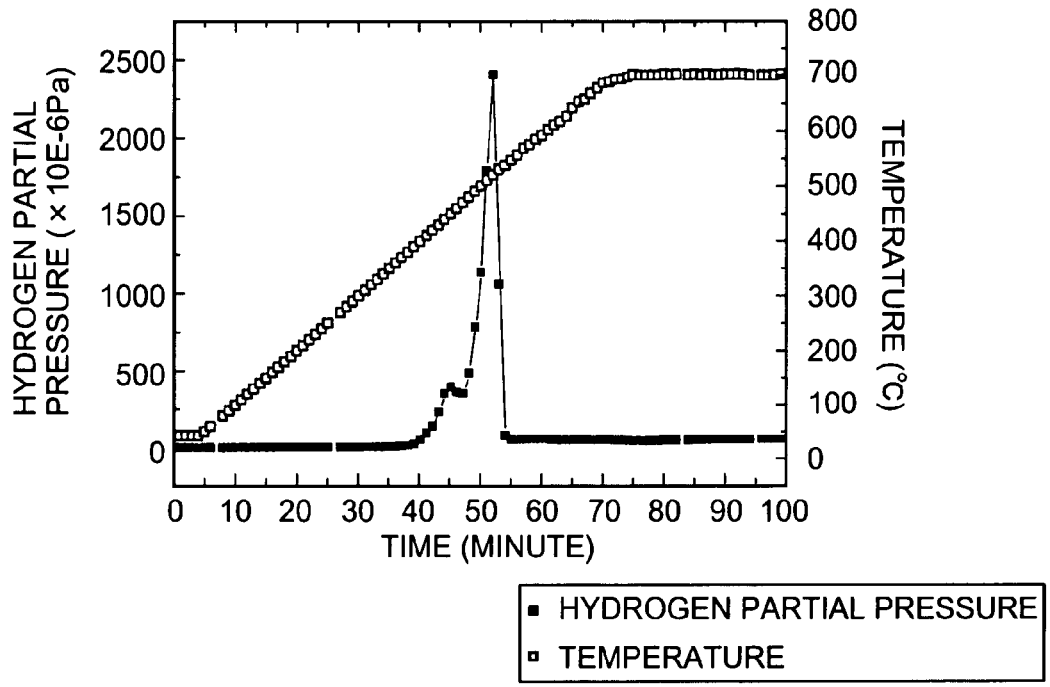
FIG. 4 is graph plotting hydrogen partial pressure values in a furnace to time, in a case where the temperature of the furnace is raised to 700° C. by 10° C./min in a vacuum and is then held at 700° C. for 30 minutes in accordance with a first manufacturing method.

Incidentally, because the $YH_2$ film easily takes in oxygen and operates to speed up the diffusion rate of oxygen in the film in comparison with the Y film, the $YH_2$ film takes in the infinitesimal oxygen (0.1 to 1 ($\times 10^{-6}$ Pa)) remaining in the furnace even in the vacuum atmosphere, and forms an $Y_2O_3$ film by replacing the hydrogen with oxygen. FIG. 4 plots hydrogen partial pressure values to times in the furnace when the temperature of the furnace has been raised up to 700° C. at the speed of 10° C./min in a vacuum and has been held at 700° C. for 30 minutes. The hydrogen partial pressure in the furnace was 1 to 2 ($\times 10^{-6}$ Pa) at the start of temperature rising, but the hydrogen partial pressure gradually became higher as the temperature rose. Consequently, the phenomenon can be considered that hydrogen $YH_2$ was disconnected from the film. Furthermore, it is considered that the $Y_2O_3$ film was formed from the result of X-ray diffraction measurement, which will be described later. Because the hydrogen partial pressure was highest at 520° C. and showed a value of 2400 ($\times 10^{-6}$ Pa), it can be said that 520° C. is sufficiently high as the anneal temperature of manufacturing the $Y_2O_3$ film.

<Second Manufacturing Method>

Figure 5:
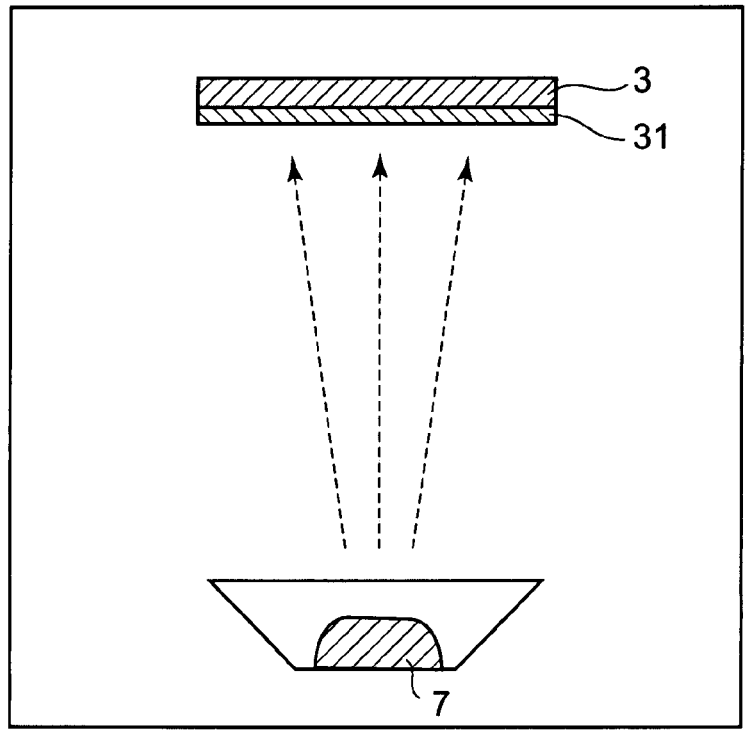
FIG. 5 is a view for explaining a vapor deposition method in accordance with a second manufacturing method.

FIG. 5 is a view for illustrating a vapor deposition method in a second manufacturing method.

First, an ingot of Y, which is a vapor deposition source, is annealed at a temperature within a range of 300° C. to 400° C. for one hour in an atmosphere including 4% by weight of hydrogen gas and the residual weight of an inert gas (Ar, Ne, or $N_2$ gas), and thereby an ingot 7 of Y including the hydrogen atom. Next, the under surface of the metal substrate is deposited using the Y ingot 7 containing hydrogen atom under the conditions that the temperature of the metal substrate (base plate 3) is 280° C., the degree of vacuum at the time of film formation is within a range of 3 to 5 ($\times 10^{-3}$ Pa) and a film formation speed is 18 nm/min. By the vapor deposition, an Y—$YH_2$—$Y_2O_3$ film is formed on the under surface of the metal substrate. Furthermore, the formed Y—$YH_2$—$Y_2O_3$ film is annealed at a temperature within a range of 300° C. to 800° C. for 30 minutes in a vacuum atmosphere, though the anneal process is not shown. Thereby, an $Y_2O_3$ film is formed (Y is combined with oxygen in the region of Y, and hydrogen combining with Y is disconnected and Y combines with oxygen in the region of $YH_2$). The thickness of the metal substrate is similar to the one described above to be 0.5 mm or less, and the film thickness of the insulation film 31 is preferably within a range of about 200 nm to about 600 nm.

This sort of method of depositing the Y ingot 7 containing hydrogen atom as a vapor deposition source and then oxidizing a metal substrate to form an $Y_2O_3$ film is preferable, because the manufacturing process thereof can be simplified in comparison with the first manufacturing method.

Second Embodiment

Figure 6:
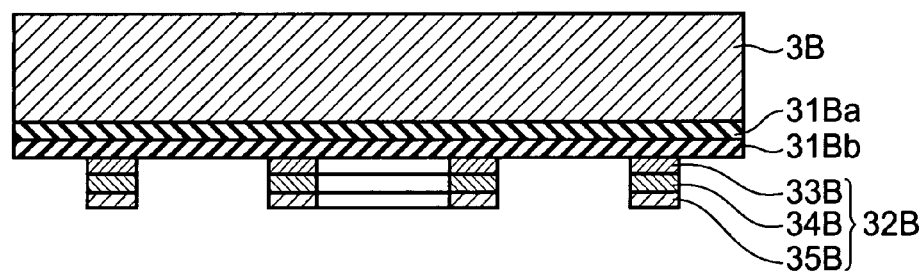
FIG. 6 is a sectional view of a cutting plane line II-II of a base plate 3B in FIG. 2 seen from the direction indicated by an arrow, in a case where an insulation film has a two-layer structure.

FIG. 6 is a sectional view seen from the arrow direction of a cutting plane line II-II of a base plate 3B similarly to FIG. 2B.

The micro reactor of a second embodiment is different from the micro reactor 1 of the first embodiment in that insulation films 31Ba and 31Bb have a two-layer structure of $Y_2O_3$ films using Y as the rare earth element R of the $R_2O_3$ films.

To put it concretely, as shown in FIG. 6, the two layer insulation films 31Ba and 31Bb having crystal structures are formed on the whole surface of the under surface of the base plate 3B. The two layer insulation films 31Ba and 31Bb are the $Y_2O_3$ films composed of a first $Y_2O_3$ film 31Ba directly formed on the under surface of the base plate 3B and a second $Y_2O_3$ film 31Bb formed on the first $Y_2O_3$ film 31Ba. The crystal structures are bixbyite structures mentioned above.

Now, four preferable methods of manufacturing the first $Y_2O_3$ film 31Ba and the second $Y_2O_3$ film 31Bb are described.

<Third Manufacturing Method>

The first $Y_2O_3$ film 31Ba is formed by directly forming the $Y_2O_3$ film on the under surface of the metal substrate (base plate 3B) by the vapor deposition method, the sputtering method, the ion plating method, the CVD method, the coating method, and the like.

The second $Y_2O_3$ film 31Bb is formed by using the first manufacturing method as mentioned above, and is formed by forming an Y film on the first $Y_2O_3$ film 31Ba by the sputtering method, and then by anneal of the formed Y film at a temperature within a range of 300° C. to 400° C. for 15 minutes in an atmosphere including 4% or less by weight of hydrogen gas and the residual weight of inert gas (Ar, Ne, or $N_2$ gas) to form an $YH_2$ film, and furthermore by anneal of the $YH_2$ film at a temperature within a range of 520° C. to 800° C. for 30 minutes in a vacuum atmosphere ($1 \times 10^{-4}$ Pa). Incidentally, the film formation method of the Y film is not limited to the sputtering method, but the vapor deposition method, the CVD method, the ion plating method, the coating method, or the like, may be used. The thickness of the metal substrate is 0.5 mm or less, and the total film thickness of the first $Y_2O_3$ film 31Ba and the film thickness of the second $Y_2O_3$ film 31Bb is preferably within a range of about 200 nm to about 600 nm owing to the relation with the substrate thickness of the metal substrate.

<Fourth Manufacturing Method>

A fourth manufacturing method is a method of manufacturing the two-layer structure of the $Y_2O_3$ film in the reverse order to that of the third manufacturing method.

The first $Y_2O_3$ film 31Ba is formed by using the first manufacturing method, and is formed similarly to the second $Y_2O_3$ film 31Bb by the third manufacturing method by forming a Y film on the surface of the metal substrate (base plate 3B) by the sputtering method, the vapor deposition method, the CVD method, the ion plating method, the coating method, or the like, and then by anneal of the formed Y film at a temperature within a range of 300° C. to 400° C. for 15 minutes in an atmosphere including 4% or less by weight of hydrogen gas and the residual weight of an inert gas (Ar, Ne, or $N_2$ gas) to form an $YH_2$ film, and furthermore by anneal of the $YH_2$ film at a temperature within a range of 520° C. to 800° C. for 30 minutes in a vacuum atmosphere ($1 \times 10^{-4}$ Pa).

The second $Y_2O_3$ film 31Bb is formed similarly to the first $Y_2O_3$ film 31Ba formed by the third manufacturing method by directly forming the $Y_2O_3$ film on the formed first $Y_2O_3$ film 31Ba by the vapor deposition method, the sputtering method, the ion plating method, the CVD method, the coating method, or the like.

<Fifth Manufacturing Method>

The first $Y_2O_3$ film 31Ba is formed similarly to the first $Y_2O_3$ film 31Ba formed by the third manufacturing method by directly forming the $Y_2O_3$ film on the surface of the metal substrate (base plate 3B) by the sputtering method, the vapor deposition method, the CVD method, the ion plating method, the coating method, or the like.

The second $Y_2O_3$ film 31Bb is formed by using the second manufacturing method to deposit an Y ingot, which is a vapor deposition source and contains hydrogen atom, on the formed first $Y_2O_3$ film 31Ba. The hydrogen-containing Y ingot can be obtained by anneal of the Y ingot at a temperature within a range of 300° C. to 400° C. for one hour in an atmosphere including 4% or less by weight of hydrogen gas and the residual weight of an inert gas (Ar, Ne, or $N_2$ gas), as described in the second manufacturing method of the first embodiment. Moreover, as vapor deposition conditions, the temperature of the metal substrate is set to 280° C.; the degree of vacuum at the time of film formation is set to be within a range of 3 to 5 ($\times 10^{-3}$ Pa); and the film formation speed is set to 18 nm/min. The Y—YH2-Y2O3 film formed by the vapor deposition is then annealed at a temperature within a range of 300° C. to 800° C. for 30 minutes in a vacuum atmosphere, and the second $Y_2O_3$ film 31Bb is formed.

<Sixth Manufacturing Method>

A sixth manufacturing method is a method of manufacturing the two-layer structure of the $Y_2O_3$ film in the reverse order to that of the fifth manufacturing method.

The first $Y_2O_3$ film 31Ba is formed by using the second manufacturing method, a hydrogen-containing Y ingot, which is a vapor deposition source, is deposited on the surface of the metal substrate (base plate 3B) similarly to the second $Y_2O_3$ film 31Bb by the fifth manufacturing method. Then, the Y—$YH_2$—$Y_2O_3$ film formed by the vapor deposition is annealed at a temperature within a range of 300° C. to 800° C. for 30 minutes in a vacuum atmosphere to form the film.

The second $Y_2O_3$ film 31Bb is formed by directly forming the $Y_2O_3$ film on the formed first $Y_2O_3$ film 31Ba by the sputtering method, the vapor deposition method, the CVD method, the ion plating method, the coating method, or the like.

Then, the thin-film heater 32B is patterned by the photolithographic technique in a state of meandering, as shown in FIG. 6, on the two layer insulation films 31Ba and 31Bb, which has been formed by any one of the four methods mentioned above. The thin-film heater 32B is similar to the aforesaid thin-film heater 32 of the first embodiment to be formed by laminating the metal-stuck layer (adhering layer) 33B, the diffusion preventing layer 34B, and the heating resistor layer 35B in order from the side of the insulation films 31Ba and 31Bb.

In the case where the insulation films 31Ba and 31Bb are made to have the two-layer structure as described above, the pinholes in the first $Y_2O_3$ film 31Ba can be reduced by the second $Y_2O_3$ film 31Bb, and the insulation films 31Ba and 31Bb can be made to have high reliabilities.

Moreover, by manufacturing the first $Y_2O_3$ film 31Ba and the second $Y_2O_3$ film 31Bb by different methods, warps arising at the time of producing the films can be suppressed as will be described later with regard to a third example. That is, if the $Y_2O_3$ film is formed on the metal substrate by the sputtering method and after that the formed $Y_2O_3$ film is annealed in order to raise the crystallite size thereof as the aforesaid third manufacturing method, then the distances between atoms are shortened in comparison with those of the $Y_2O_3$ film immediately after film formation, and the $Y_2O_3$ film shrinks. Consequently, the metal substrate is pulled by the film to be convex downward. If the metal substrate distorted like this is, for example, joined with another metal member, the metal substrate cannot be joined with the other one owing to the decrease of the contact area thereof, and the distortion of the metal substrate exerts bad influences on the other processes. If the second $Y_2O_3$ film 31Bb is formed as described above on the first $Y_2O_3$ film 31Ba formed on the metal substrate that has been warped to be convex downward by the formation of the first $Y_2O_3$ film 31Ba, then the crystal $Y_2O_3$ film is formed by taking in oxygen in comparison with immediately after the film formation of the first $Y_2O_3$ film 31Ba, and consequently the film extends to warp to be convex upward that much. As described above, because the warp of the metal substrate in the case of forming films varies with the first $Y_2O_3$ film 31Ba and the second $Y_2O_3$ film 31Bb, the warp of the metal substrate can be cancelled by combining the $Y_2O_3$ films formed by different manners from each other.

FIRST APPLIED EXAMPLE

Next, a micro reactor module 100 is described as an applied example.

Figure 7:
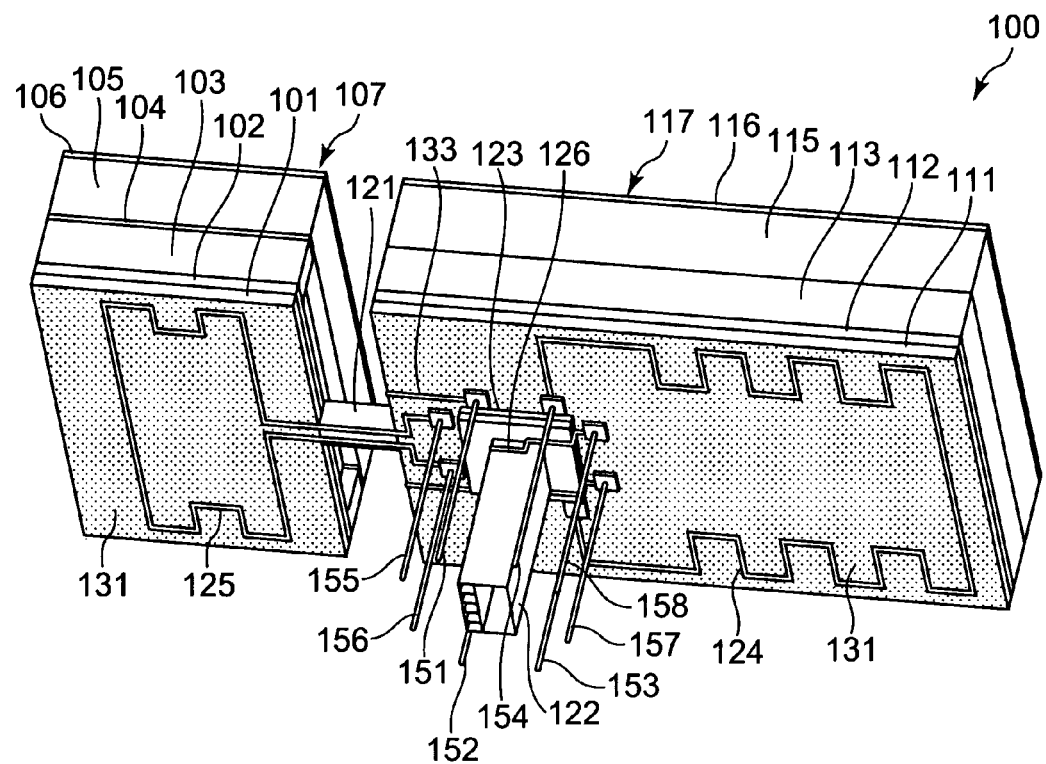
FIG. 7 is a perspective view showing a micro reactor module 100 from an oblique lower position.
Figure 8:
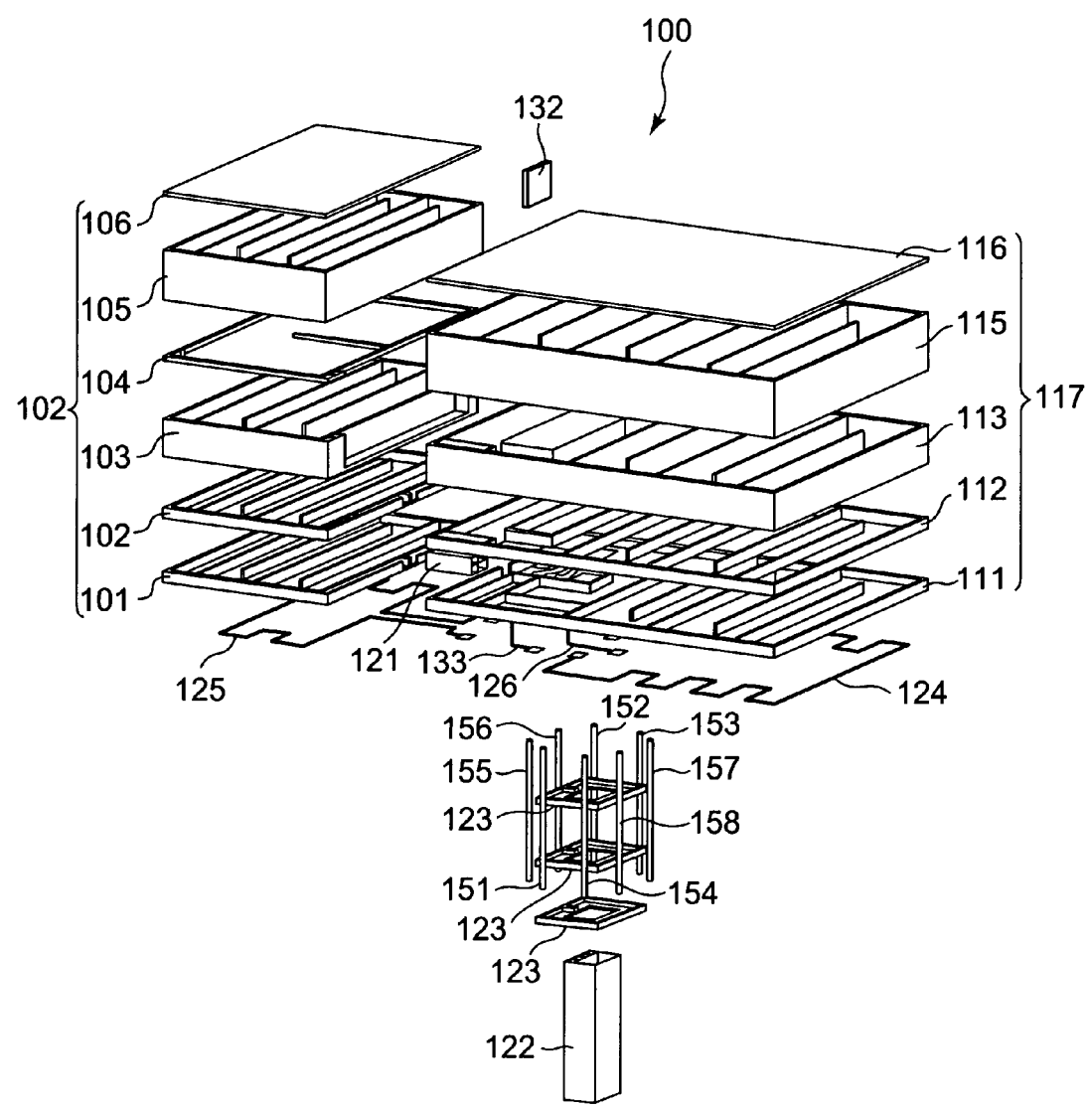
FIG. 8 is an exploded perspective view of the micro reactor module 100.
Figure 9:
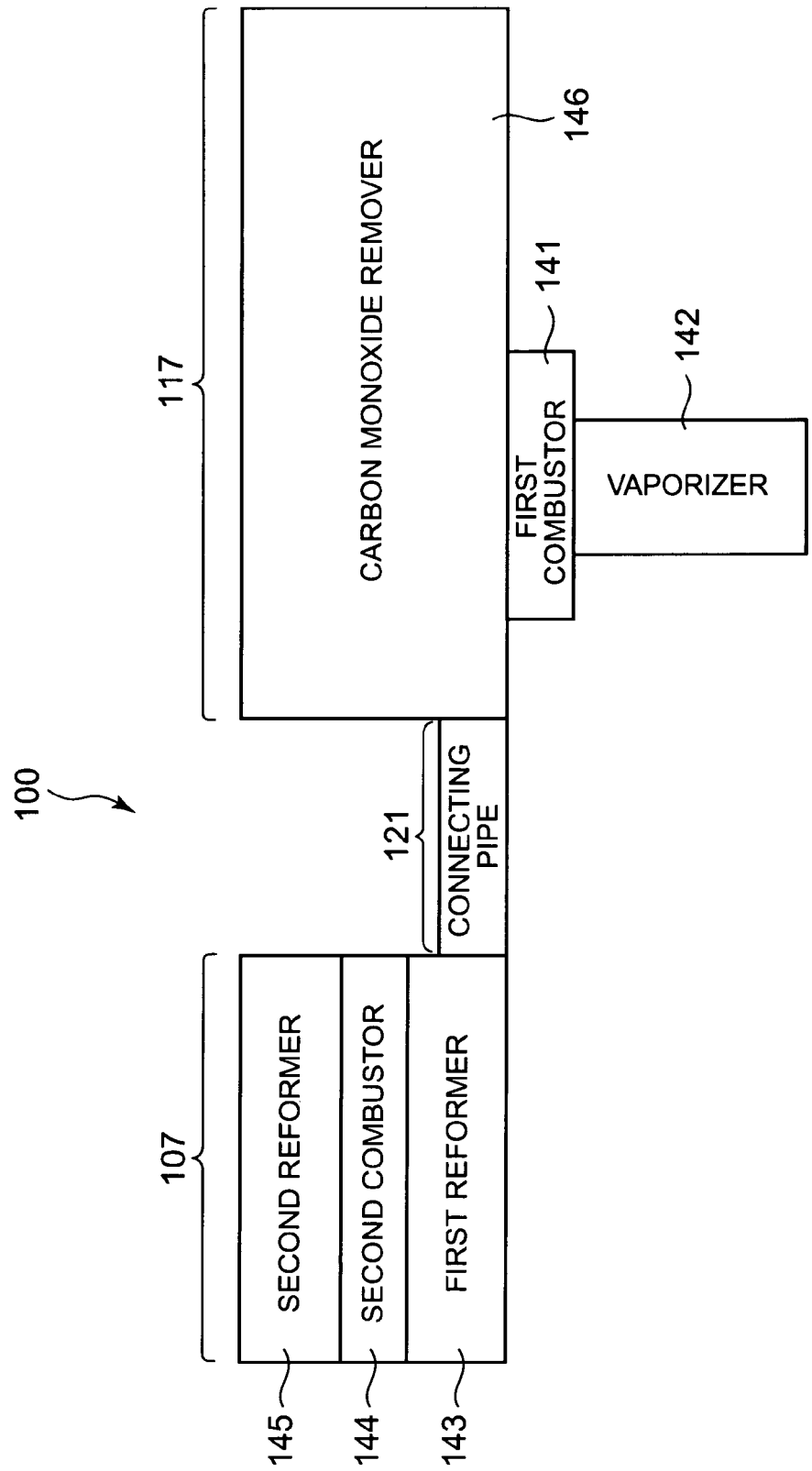
FIG. 9 is a schematic side view in the case of dividing the micro reactor module 100 into each function.
Figure 10:
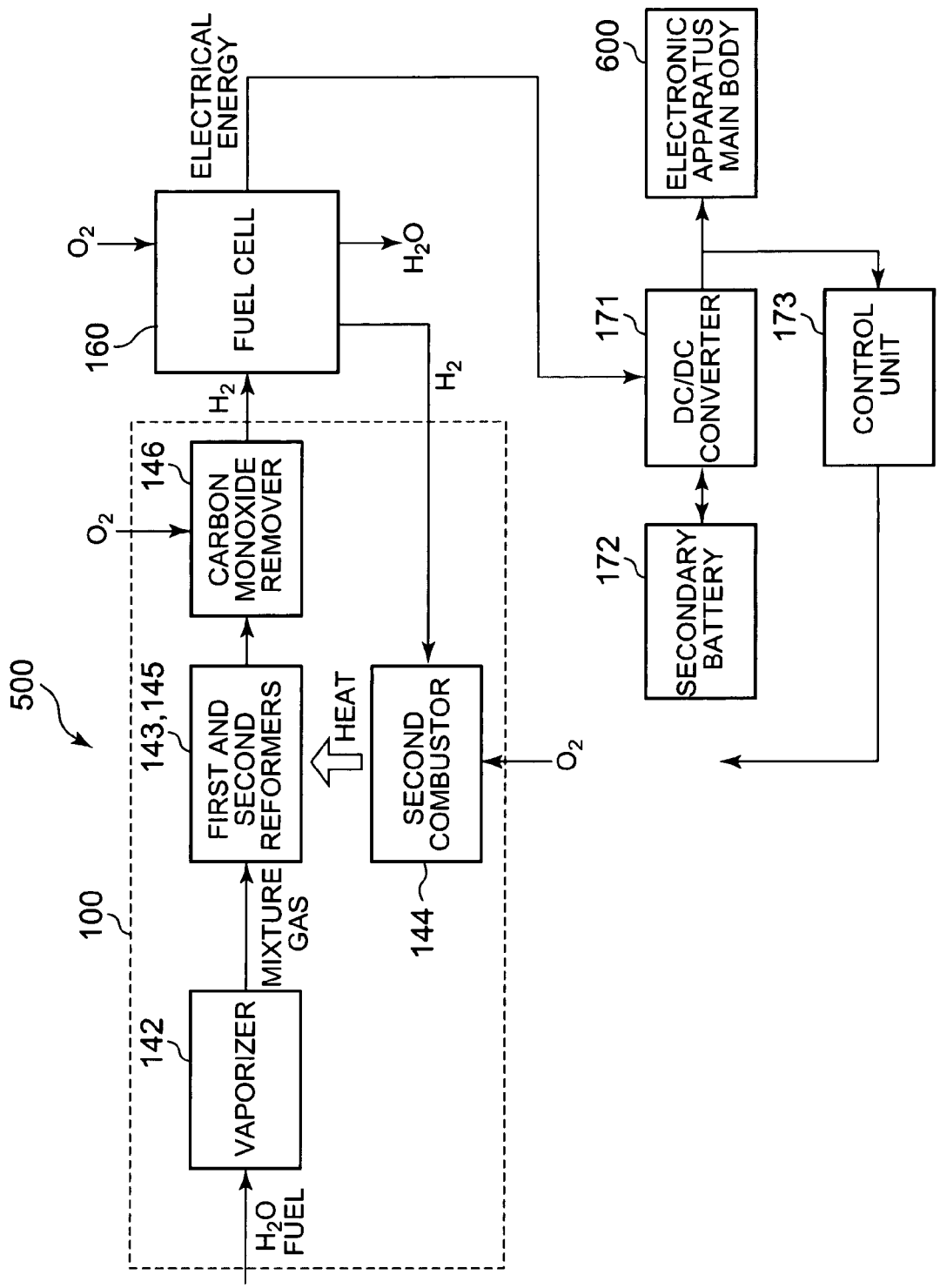
FIG. 10 is a block diagram including a power generating system 500 equipped with the micro reactor module 100 and a fuel cell 160, and an electronic apparatus main body 600.

FIG. 7 is a perspective view showing the micro reactor module 100 from an oblique lower position; FIG. 8 is an exploded perspective view of the micro reactor module 100; FIG. 9 is a schematic side view of the micro reactor module 100 in the case of dividing the micro reactor module 100 into each function; and FIG. 10 is a block diagram of a power generating system 500 including the micro reactor module 100 and a fuel cell (generator cell) 160, and an electronic apparatus main body 600.

The micro reactor module 100 includes a high temperature reaction unit 107 laminating a base plate 101, a lower part frame 102, a medium part frame 103, a combustor plate 104, an upper part frame 105, and a lid plate 106; a low temperature reaction unit 117 laminating a base plate 111, a lower part frame 112, a medium part frame 113, an upper part frame 115, and a lid plate 116; a connecting pipe 121 installed between the high temperature reaction unit 107 and the low temperature reaction unit 117; a multi-tubular member 122 coupled to the under surface of the low temperature reaction unit 117; three combustor plates 123 laminated in the neighborhood of the multi-tubular member 122; a heating wire (thin-film heater) 124 patterned on the under surface of the low temperature reaction unit 117; a heating wire (thin-film heater) 125 patterned on the under surfaces of from the low temperature reaction unit 117 to the connecting pipe 121 and the high temperature reaction unit 107; and a heating wire (thin-film heater) 126 patterned on the under surface of the low temperature reaction unit 117 to the external surface of the combustor plates 123.

Moreover, an insulation film 131 is formed on the whole surface of each of the space between the patterned heating wire 124 and the under surface (base plate 111) of the low temperature reaction unit 117 and the space between the patterned heating wire 125 and the under surface (base plate 101) of the high temperature reaction unit 107. Each of the insulation films 131 is an $Y_2O_3$ film, which is formed by the sputtering method similarly to the insulation film 31 mentioned above and uses Y as the rare earth element R of the $R_2O_3$ film having the bixbyite structure. As the film formation method, not only the sputtering method, but also the vapor deposition method, the CVD method, the ion plating method, the coating method, and the like, can be used. The film thickness of the insulation film 131 is preferably within a range about 200 nm to about 600 nm.

The three combustor plates 123 are plates having side walls and concave portions provided with ribs partitioning flow paths on their peripheries, and having through holes formed at their central parts. The multi-tubular member 122 is fit into the through hole. The combustor plates 123 are laminated by being joined together around the multi-tubular member 122, and further the top combustor plate 123 is joined to the under surface of the low temperature reaction unit 117. Thereby a flow path is formed in the joint surfaces, and the three combustor plates 123 constitute a first combustor 141 (FIG. 9). Air and gaseous fuel (for example, a hydrogen gas, a methanol gas, or the like) are supplied to the first combustor 141 individually or as a mixture gas through the multi-tubular member 122, and catalytic combustion is caused by the catalyst applied in the flow path among the combustor plates 123.

Moreover, water and liquid fuel (for example, methanol, ethanol, dimethyl ether, butane, or gasoline) are supplied from a fuel container to the multi-tubular member 122 individually or in a mixed state, and the multi-tubular member 122 constitutes a vaporizer 142 (FIG. 9) vaporizing the water and the liquid fuel by the combustion heat in the first combustor 141. The mixture gas of the vaporize fuel and the vaporized water is sent to the inner part of the lower part of the high temperature reaction unit 107 through the flow path of the base plate 111 and the connecting pipe 121.

The lower part of the high temperature reaction unit 107 is composed by laminating the base plate 101, the lower part frame 102, and the medium part frame 103, and a flow path is formed in the inner part of the laminated body, which constitutes a first reformer 143 (FIG. 9). The vaporized mixture gas flows through the flow path of the first reformer 143 to produce hydrogen and the like by a catalytic reaction. If the liquid fuel in the mixture gas is methanol, the catalytic reaction can be expressed by the following formula (1). Furthermore, by the reaction expressed by the following formula (2), carbon monoxide, which is a by-product, is produced, although the quantity thereof is infinitesimal.

$$CH_3OH + H_2O \rightarrow 3H_2 + CO_2 \quad (1)$$

$$H_2 + CO_2 \rightarrow H_2O + CO \quad (2)$$

Although heat is needed for the catalytic reaction, heat energy is supplied by the heating wire 125 and the combustor plate 104. The combustor plate 104 is a plate having a side wall and a concave portion provided with a rib partitioning a flow path on the periphery. The joining of the combustor plate 104 to the upper part frame 105 forms a combustion chamber in the joint surfaces, and the combustion chamber constitutes a second combustor 144 (FIG. 9). The mixture gas of the gaseous fuel (for example, a hydrogen gas, a methanol gas, or the like) and air is supplied to the combustion chamber (second combustor 144 (FIG. 9)) through the multi-tubular member 122, the flow path of the base plate 111, and the connecting pipe 121, and catalytic combustion arises in the combustion chamber. The high temperature reaction unit 107 is heated to a temperature within a range of about 280° C. to 400° C. by the second combustor 144 (FIG. 9).

The mixture gas is further sent from the laminated body of the base plate 101, the lower part frame 102, and the medium part frame 103 to the inner part of the upper part frame 105. A plurality of partition walls is formed in the inner part of the upper part frame 105, and a flow path is formed in the inner part of the upper part frame 105 by blocking the upper side opening of the upper part frame 105 with the lid plate 106. Thereby, a second reformer 145 (FIG. 9) is configured. The mixture gas sent to the inner part of the upper part frame 105 flows through the flow path in the inner part of the upper part frame 105, and hydrogen gas and the like is produced by the catalytic reaction. Furthermore, carbon monoxide, which is a by-product, is produced, although the quantity thereof is infinitesimal (see the formulae (1) and (2)). The mixture gas containing hydrogen and the like is sent to the inner part of the low temperature reaction unit 117 through the connecting pipe 121.

The low temperature reaction unit 117 is the unit produced by laminating the base plate 111, the lower part frame 112, the medium part frame 113, the upper part frame 115, and the lid plate 116. A flow path is formed in the inner part of the laminated body, which constitutes a carbon monoxide remover 146 (FIG. 9). The mixture gas flows through the flow path of the carbon monoxide remover 146, and the carbon monoxide, produced in accordance with the formula (2), in the mixture gas is selectively oxidized in accordance with the following formula (3):

$$2CO + O_2 \rightarrow 2CO_2 \quad (3).$$

Because the selective oxidation reaction of the carbon monoxide occurs at a temperature (within a range of about 100° C. to about 180° C.) higher than a room temperature, the low temperature reaction unit 117 is heated by the heating wire 124 and the combustor plates 123. A hydrogen rich gas obtained by removing carbon monoxide in the low temperature reaction unit 117 is supplied to the anode of the fuel cell 160 through the multi-tubular member 122. In the fuel cell 160, air is supplied to the cathode, and electrical energy is generated by the electrochemical reaction between oxygen and hydrogen.

As shown in FIG. 10, the power generating system 500 also includes a DC/DC converter 171 converting the electrical energy generated by the fuel cell 160 into a pertinent voltage, a secondary battery 172 connected to the DC/DC converter 171, and a control unit 173 controlling the above units.

The DC/DC converter 171 is configured to also perform the function of charging the secondary battery 172 with the electrical energy generated by the fuel cell 160 to supply the electrical energy from the side of the secondary battery 172 to the electronic apparatus main body 600 when the fuel cell 160 is not operated besides the function of converting the electrical energy generated by the fuel cell 160 into a pertinent voltage to supply the converted voltage to the electronic apparatus main body 600 after that. The control unit 173 controls the vaporizer 142, first and second reformers 143 and 145, the carbon monoxide remover 146, the second combustor 144, a not shown pump and not shown valves that are necessary for operating the fuel cell 160, heaters, the DC/DC converter 171, and the like, to perform the control enabling the stable supply of electrical energy to the electronic apparatus main body 600.

The high temperature reaction unit 107, the low temperature reaction unit 117, and the connecting pipe 121 are housed in a heat insulating package (not shown). Because the inside of the heat insulating package is set to a vacuum pressure, an adiabatic effect becomes higher. Moreover, a getter material 132 is provided in the heat insulating package. When a voltage is applied to the heater of the getter material 132 through lead wires 151 and 152, and wiring 133, the getter material 132 is activated to raise the degree of vacuum in the heat insulating package. Several lead wires are also provided besides the lead wires 151 and 152. Lead wires 153 and 154 are connected to the heating wire 124; lead wires 155 and 156 are connected to the heating wire 125; and lead wires 157 and 158 are connected to the heating wire 126.

As described above, the $Y_2O_3$ film (insulation film 131) using Y as the rare earth element R of the $R_2O_3$ film having a crystal structure (bixbyite structure) is provided between the under surfaces of the base plates 101 and 111 and the heating wires 125 and 124 formed on the under surfaces, respectively, in the micro reactor module 100. Because the $Y_2O_3$ film has a heat expansion coefficient very near to that of the metal under the environment of temperature higher than a room temperature, the cracks and the peel-off of the insulation film 131 owing to the distortions of the base plates 101 and 111 can be prevented, and the micro reactor module 100 can be made to be the one having an excellent withstand voltage performance.

SECOND APPLIED EXAMPLE

Figure 11:
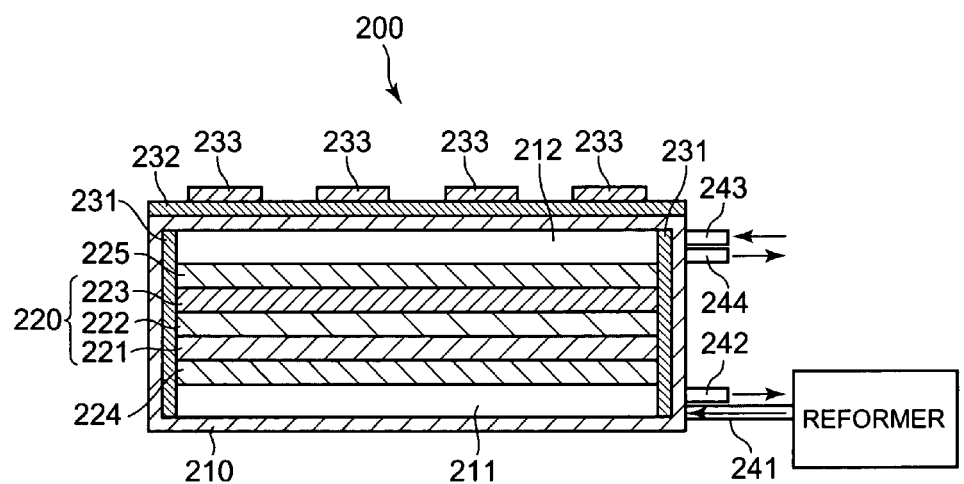
FIG. 11 is a schematic sectional view of a solid oxide fuel cell 200.

The aforesaid first applied example supposes the chemical reactor for performing hydrogen manufacturing, but the applied examples are not limited to this one. The insulation film made of the $Y_2O_3$ film using Y as the rare earth element R of the $R_2O_3$ film having the crystal structure (bixbyite structure) can be also used for a device operating at a high temperature (600-900° C.), such as a fuel cell (generator cell) of a solid oxide including a reformer and the like. FIG. 11 is a schematic sectional view of a fuel cell 200 of a solid oxide.

The fuel cell 200 includes a box-shaped metallic container 210, a membrane electrode assembly 220 provided in the metallic container 210, and a fuel taking-in portion 211 and an oxygen taking-in portion 212, which are formed in the metallic container 210 on the upper side thereof and on the lower side thereof, respectively, by partitioning the metallic container 210 by the membrane electrode assembly 220.

The metallic container 210 is made of an alloy such as Ni, a Ni—Cr alloy, or Inconel™ having a good heat resisting property. The membrane electrode assembly 220 includes an anode film 221, a solid oxide electrolyte film 222, and a cathode film 223. The anode film 221 in the metallic container 210 is arranged on the side of the fuel taking-in portion 211, and the cathode film 223 is arranged on the side of the oxygen taking-in portion 212 in the metallic container 210. The solid oxide electrolyte film 222 intervenes between the anode film 221 and the cathode film 223, and the anode film 221, the solid oxide electrolyte film 222, and the cathode film 223 are joined together. A collector 224 on the anode side is formed on the surface on the opposite side to the solid oxide electrolyte film 222 of the anode film 221, and a collector 225 on the cathode side is formed on the surface on the opposite side to the solid oxide electrolyte film 222 of the cathode film 223. An $Y_2O_3$ film 231, which is an insulation film, is formed on the internal surface of the metallic container 210. The insulation film 231 is the $Y_2O_3$ film that has a crystal structure (bixbyite structure) and is formed by the sputtering method, similarly to the aforesaid insulation film 31. The film formation method is not limited to the sputtering method, but the vapor deposition method, the CVD method, the ion plating method, the coating method, and the like, can be also applied.

Any of the anode film 221, the solid oxide electrolyte film 222, the cathode film 223, and the two collectors 234 and 235 is provided between the insulation films 231 formed on the internal surfaces opposed to each other in the metallic container 210 so as to be parallel to the top surface and the under surface of the metallic container 210.

The solid oxide electrolyte film 222 has the role of carrying oxygen ions from the cathode film 223 to the anode film 221, and has a character of allowing oxygen ions to permeate the solid oxide electrolyte film 222. The solid oxide electrolyte film 222 is made of yttria-stabilized zirconia (YSZ), which is stable in an oxidation-reduction atmosphere, or the like.

In the cathode film 223, the oxygen in the introduced air is absorbed and dissociated onto the electrode (cathode), and the oxygen is combined with electrons to generate oxygen ions in the reaction field. Accordingly, for example, $La_{1-x}Sr_xMnO_3$, which is a porous material stable in an oxidizing atmosphere and has a good electron conductivity, is used as the material of the cathode film 223.

In the anode film 221, the introduced hydrogen reacts with oxygen ions to produce steam and electrons. Accordingly, for example, cermet (Ni/YSZ), which is a porous material stable in a reducing atmosphere and has a good affinity with hydrogen and a high electronic conductivity, is used as the material of the anode film 221.

Because the collectors 224 and 225 assume a role of current collectors, for example, a Ni—Cr alloy or a Fe—Cr alloy, which has a high electronic conductivity and a low ionic conductivity, is used as the material of the collectors 224 and 225.

The lateral surface of the metallic container 210 is provided with a fuel feeding pipe 241, which is coupled to a reformer to take in the fuel ($H_2$) produced by the reformer to the fuel taking-in portion 211, and a fuel exhausting pipe 242, which exhausts the unreacted fuel ($H_2$) that has not been used for power generation, both pipes 241 and 242 piercing the lateral surface. Moreover, the lateral surface of the metallic container 210 is provided with an oxygen supplying pipe 243, which takes in oxygen to the oxygen taking-in portion 212, and an oxygen exhausting pipe 244, which exhausts the unreacted oxygen that has not been used for power generation, both pipes 243 and 244 piercing the lateral surface.

On the top surface of the metallic container 210, an insulation film 232 is formed on the whole surface thereof. The insulation film 232 is an $Y_2O_3$ film, which has a crystal structure (bixbyite structure) and is formed by the sputtering method similarly to the aforesaid insulation film 31. The film formation method thereof is not limited to the sputtering method, but the vapor deposition method, the CVD method, the ion plating method, the coating method, or the like, can be used. The film thickness of the insulation film 232 is preferably within a range of about 200 nm to about 600 nm.

On the insulation film 232, a thin-film heater 233 is patterned in a meandering state by the photolithographic technique. The thin-film heater 233 is formed by laminating a metal-stuck layer (an adhering layer) (for example, Ta, Mo, Ti, or Cr), a diffusion preventing layer (for example, W), and a heating resistor layer (for example, Au) in order from the side of the insulation film 232. The film thickness of the metal-stuck layer is preferably within a range of 100 nm to 200 nm; the film thickness of the diffusion preventing layer is preferably within a range of 50 nm to 100 nm; and the film thickness of the heating resistor layer is preferably within a range of 200 nm to 400 nm. The thin-film heater 233 heats the metallic container 210 at the time of starting, and the electric resistance of the thin-film heater 233 changes dependently on the temperature thereof. The thin-film heater 233 also functions as a temperature sensor reading a change of the temperature from the change of the resistance value. To put it concretely, the thin-film heater 233 uses a region in which the temperature of the thin-film heater 233 linearly changes to the electric resistance.

In the fuel cell 200 having the aforesaid configuration, a voltage is applied to a lead wire (not shown) connected to the thin-film heater 233 to make the thin-film heater 233 produce heat. Thereby, in the state of heating the metallic container 210 at a temperature within a range of about 700° C. to about 1000° C., hydrogen is supplied from the fuel feeding pipe 241 to the fuel taking-in portion 211, and the hydrogen unused for the electrochemical reaction in the membrane electrode assembly 220 is exhausted from the fuel exhausting pipe 242. On the other hand, air containing oxygen is supplied from the oxygen supplying pipe 243 to the oxygen taking-in portion 212, and the oxygen is ionized in the cathode film 223 to permeate the solid oxide electrolyte film 222. The oxygen unused for the electrochemical reaction in the membrane electrode assembly 220 is exhausted from the oxygen exhausting pipe 244. The oxygen ions that have permeated the solid oxide electrolyte film 222 reacts with hydrogen in the anode film 221 to produce water in the fuel taking-in portion 211. The electrons generated at this time return from the collector 225 on the cathode side to the collector 224 on the anode side through the wiring and an external circuit to be conducted. The produced water is in a steam state, and is exhausted from the fuel exhausting pipe 242. In this manner, electrical energy is generated with the movement of the oxygen ions.

THIRD APPLIED EXAMPLE

Figure 12:
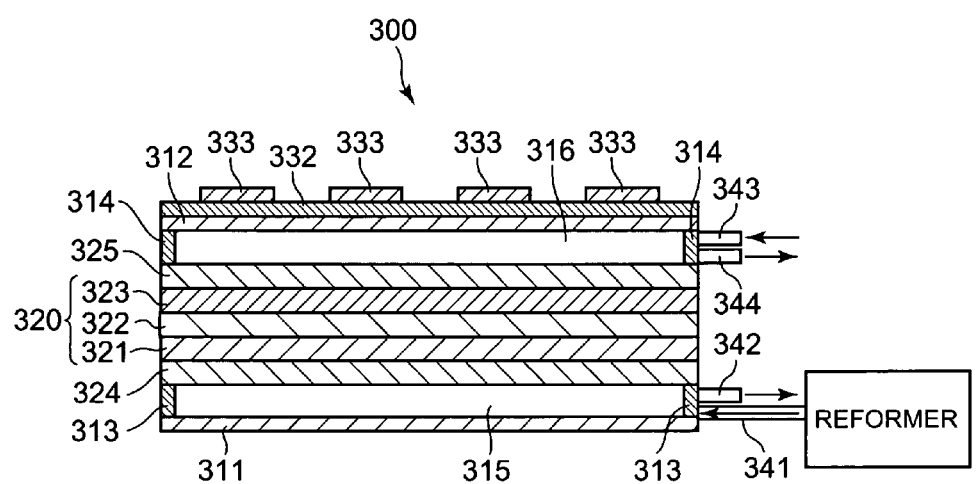
FIG. 12 is a schematic sectional view of another solid oxide fuel cell 300.

FIG. 12 is a schematic sectional view of another solid oxide fuel cell 300.

The fuel cell 300 shown in FIG. 12 does not use metallic container 210 unlike the aforesaid fuel cell 200, but uses two metal substrates 311 and 312. To put it concretely, the fuel cell 300 includes the two metal substrates 311 and 312 arranged to be opposed to each other above and below, a membrane electrode assembly 320 provided between the two metal substrates 311 and 312 so as to be in parallel with both the metal substrates 311 and 312, prop units 313 and 314 fixing the membrane electrode assembly 320 to the metal substrates 311 and 312, a fuel taking-in portion 315 formed between the membrane electrode assembly 320 and the metal substrate 311 on the lower side by being partitioned by the membrane electrode assembly 320, and an oxygen taking-in portion 316 formed between the membrane electrode assembly 320 and the metal substrate 312 on the upper side.

In the circumferential portion of the top surface of metal substrate 311 on the lower side, the prop unit 313 provided in an upward standing condition is formed in a frame. In the circumferential portion of the under surface of the metal substrate 312 on the upper side, the prop unit 314 provided in a downward standing condition is formed in a frame. These prop units 313 and 314 are made of an insulating material, such as a ceramic.

The membrane electrode assembly 320 is supported in a state of being put between the prop unit 313 on the lower side and the prop unit 314 on the upper side, and spaces are hereby formed severally between the metal substrate 311 on the lower side and the membrane electrode assembly 320 and between the metal substrate 312 on the upper side and the membrane electrode assembly 320. The membrane electrode assembly 320 includes an anode film 321, a solid oxide electrolyte film 322, and a cathode film 323. The anode film 321 is arranged to face to the side of the fuel taking-in portion 315, and the cathode film 323 is arranged to face to the side of the oxygen taking-in portion 316. The solid oxide electrolyte film 322 intervenes between the anode film 321 and the cathode film 323, and the anode film 321, the solid oxide electrolyte film 322, and the cathode film 323 are joined together. A collector 324 on the anode side is formed on the surface of the anode film 321 on the opposite side to the solid oxide electrolyte film 322, and a collector 325 on the cathode side is formed on the surface of the cathode film 323 on the opposite side to the solid oxide electrolyte film 322. Any of the anode film 321, the solid oxide electrolyte film 322, the cathode film 323, and the two collectors 324 and 325 is provided between the prop units 313 and 314 on both the right and left sides so as to be parallel to the two metal substrates 311 and 312.

The solid oxide electrolyte film 322, the anode film 321, and the cathode film 323 are similar ones to those mentioned above, and their descriptions are accordingly omitted.

The lateral surface of the prop unit 313 on the lower side is provided with a fuel feeding pipe 341, which is coupled to a reformer to take in the fuel ($H_2$) produced by the reformer to the fuel taking-in portion 315, and a fuel exhausting pipe 342, which exhausts the unreacted fuel ($H_2$) that has not been used for power generation, both pipes 341 and 342 piercing the lateral surface. Moreover, the lateral surface of the prop unit 314 on the upper side is provided with an oxygen supplying pipe 343, which takes in oxygen to the oxygen taking-in portion 316, and an oxygen exhausting pipe 344, which exhausts the unreacted oxygen that has not been used for power generation, both pipes 343 and 344 piercing the lateral surface.

On the top surface of the metal substrate 312 on the upper side, an insulation film 332 is formed on the whole surface thereof. The insulation film 332 is an $Y_2O_3$ film, which has a crystal structure (bixbyite structure) and is formed by the sputtering method similarly to the aforesaid insulation film 31. The film formation method thereof is not limited to the sputtering method, but the vapor deposition method, the CVD method, the ion plating method, the coating method, or the like, can be used. The film thickness of the insulation film 332 is preferably within a range of about 200 nm to about 600 nm.

On the insulation film 332, a thin-film heater 333 is patterned in a meandering state by the photolithographic technique. The thin-film heater 333 is formed by laminating a metal-stuck layer (an adhering layer) (for example, Ta, Mo, Ti, or Cr), a diffusion preventing layer (for example, W), and a heating resistor layer (for example, Au) in order from the side of the insulation film 332. The film thickness of the metal-stuck layer is preferably within a range of 100 nm to 200 nm; the film thickness of the diffusion preventing layer is preferably within a range of 50 nm to 100 nm; and the film thickness of the heating resistor layer is preferably within a range of 200 nm to 400 nm. The thin-film heater 333 heats the metallic container at the time of starting, and the electric resistance of the thin-film heater 333 changes dependently on the temperature thereof. The thin-film heater 333 also functions as a temperature sensor reading a change of the temperature from the change of the resistance value. To put it concretely, the thin-film heater 333 uses a region in which the temperature of the thin-film heater 333 linearly changes to the electric resistance.

Also in the fuel cell 300 having the aforesaid configuration, a voltage is applied to a lead wire connected to the thin-film heater 333 to make the thin-film heater 333 produce heat, and thereby a housing composed of the metal substrates 311 and 312, and the like, is heated to a temperature within a range of about 600° C. to about 900° C. In this state, hydrogen is supplied from the fuel feeding pipe 341 to the fuel taking-in portion 315, and the hydrogen that has not been used for the electrochemical reaction in the membrane electrode assembly 320 is exhausted from the fuel exhausting pipe 342. On the other hand, air containing oxygen is supplied from the oxygen supplying pipe 343 to the oxygen taking-in portion 316, and the oxygen is ionized in the cathode film 323 to permeate the solid oxide electrolyte film 322. The unreacted oxygen that has not been used for the electrochemical reaction in the membrane electrode assembly 320 is exhausted from the oxygen exhausting pipe 344. The oxygen ions that have permeated the solid oxide electrolyte film 322 reacts with hydrogen in the anode film 321, and water is produced in the fuel taking-in portion 315. The electrons generated at this time return from the collector 325 on the cathode side to the collector 324 on the anode side through wiring and an external circuit to be conducted. The produced water is in a steam state, and is exhausted from the fuel exhausting pipe 342. In this manner, electrical energy is generated with the movement of the oxygen ions.

As described above, in the solid oxide fuel cells 200 and 300 shown in FIGS. 11 and 12, respectively, the $Y_2O_3$ films (insulation films 232 and 332) using Y as the rare earth elements R of the $R_2O_3$ films having the crystal structures (bixbyite structures) are provided between the top surfaces of the metallic container 210 and the thin-film heaters 233, which are provided on the top surfaces, and between the top surfaces of the metal substrate 312 and the thin-film heaters 333. Consequently, even if an operating temperature is within a range of 600° C. to 900° C. to be very high, the heat expansion coefficients of the thin-film heaters 233 and 333 are very near to that of the metal. Hence the cracks and the peel-off of the insulation films 232 and 332 owing to the distortions of the metallic container 210 and the metal substrate 312 can be prevented, and the solid oxide fuel cells 200 and 300 can severally have an excellent withstand voltage performance.

Incidentally, although the examples of the solid oxide fuel cell type have been described here, the other type fuel cell, such as a molten carbonate fuel cell, may be adopted.

FIRST EXAMPLE

Next, it will be described in the following that an $Y_2O_3$ film formed by using Y as the rare earth element R of an $R_2O_3$ film crystallizes, and that the $Y_2O_3$ film is hard to cause insulation breakdown when a voltage is applied to a thin-film heater.

<X-Ray Diffraction Measurement of $Y_2O_3$ Film>

An $Y_2O_3$ film (200 nm) was formed on a Si substrate having a heat-oxidization film using a sputtering technique. The sputtering conditions were as follows: target material: $Y_2O_3$; ultimate pressure: $5\times10^{-4}$ Pa; flow rate of Ar: 50 sccm; sputtering pressure: 0.3 Pa; and sputtering power: 200 W. The samples of the formed $Y_2O_3$ film were respectively annealed at the temperatures of 600° C. and 800° C. for 30 minutes in the air atmosphere, and were measured by X-ray diffraction measurement.

Figure 13:
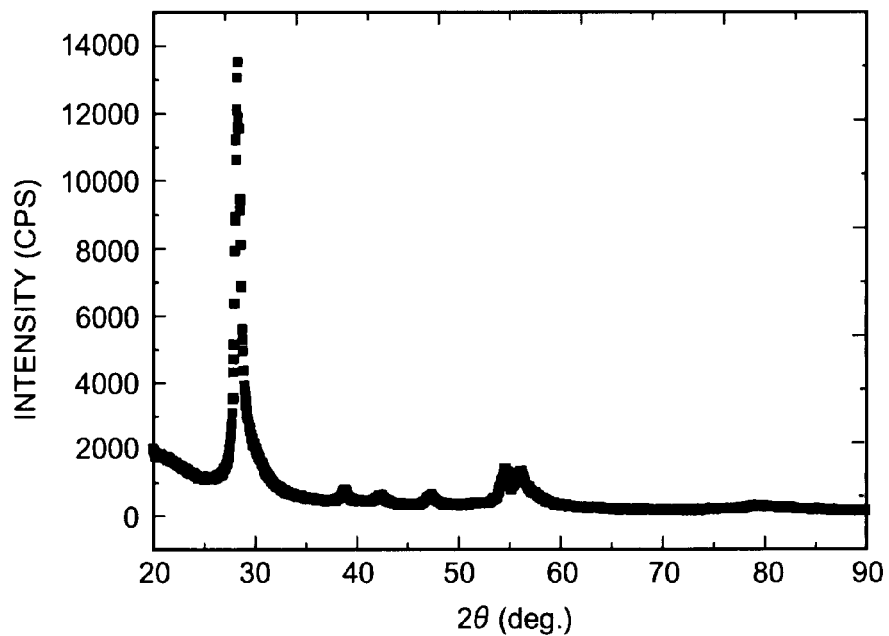
FIG. 13 is a diagram showing a result of the X-ray diffraction measurement of an $Y_2O_3$ film immediately after film formation.

The $Y_2O_3$ film was reported to have a bixbyite structure and a grating constant of 1.06 nm. The $Y_2O_3$ film has 36 peaks to be observed, when the 2θ range is within 20° to 90° (see Joint Committee on Powder Diffraction Standards (JCPDS) cards). FIG. 13 is a diagram showing a result of X-ray diffraction measurement of the $Y_2O_3$ film immediately after film formation. Although not all of the 36 peaks were observed by the measurement, a comparatively sharp peak was observed differently from a wide peak structure peculiar to a material having an amorphous structure. The grating constant estimated from the result was 1.09 nm, and it can be understood that the $Y_2O_3$ film has a crystal structure in which grating has somewhat extended.

Figure 14:
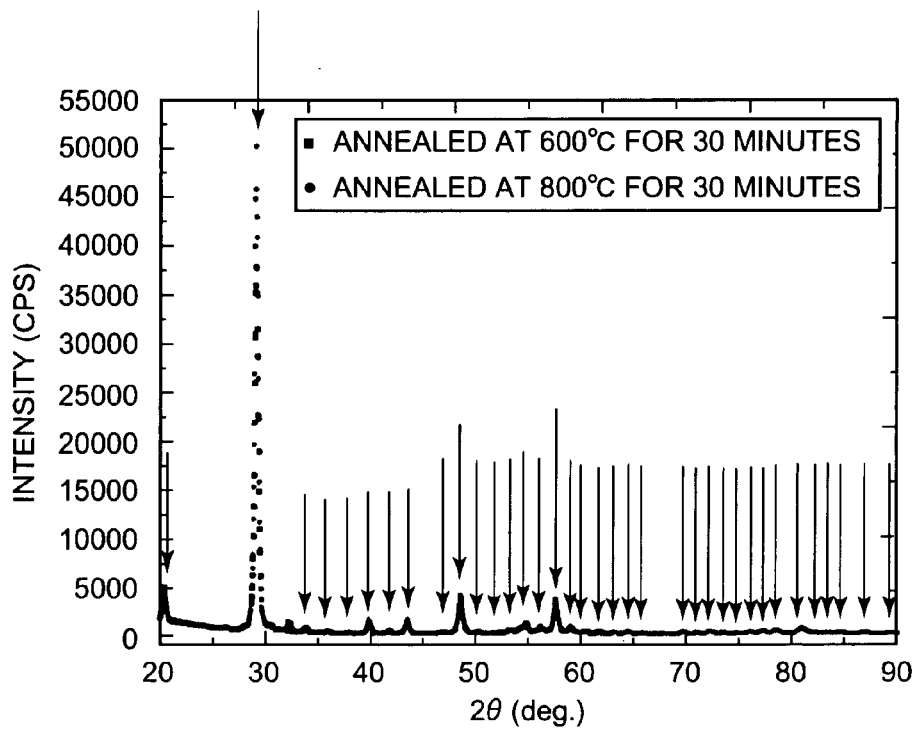
FIG. 14 is a diagram showing a result of the X-ray diffraction measurement of an $Y_2O_3$ film annealed in the air atmosphere.

FIG. 14 is a diagram showing a result of X-ray diffraction measurement of an $Y_2O_3$ film that was annealed in an air atmosphere. The anneal temperatures were 600° C. and 800° C., and the holding time was 30 minutes. The annealed samples had sharper peaks in comparison with that of the film immediately after film formation, and all the peaks written in the JCPDS cards were able to be observed in a measurement range. Moreover, the grating constant calculated based on the measured data were estimated to be 1.06 nm in both the samples at 600° C. and 800° C., and the data agreed with the grating constant written in the JCPDS cards. It can be considered that the crystallinity of the film was further improved by an annealing effect. It can be said that the $Y_2O_3$ film has already had the crystallinity immediately after film formation and the crystallinity of the film can be more raised in the anneal process thereof.

<Evaluation of Withstand Voltage of $Y_2O_3$ Film>

Figure 15A:
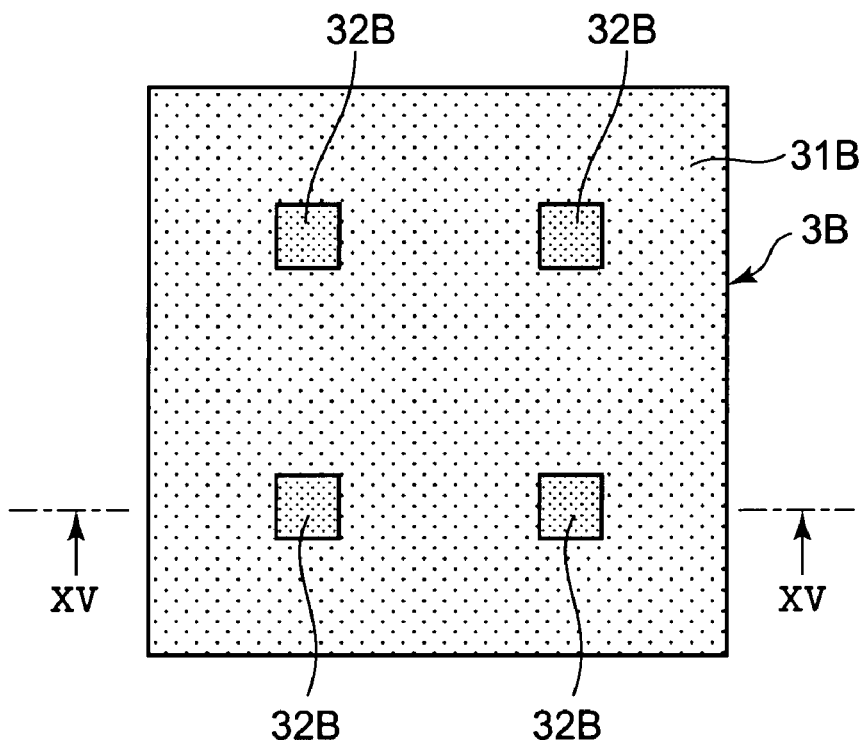
FIG. 15A is a plan view of a sample 3B for a withstand voltage test.
Figure 15B:
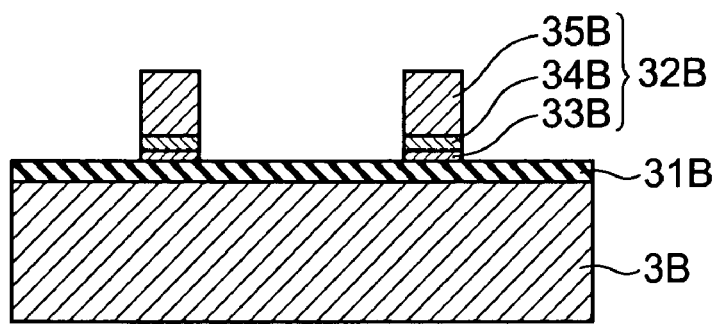
FIG. 15B is a sectional view seen from the arrow direction of a cutting plane line XV-XV of FIG. 15A.

Next, a performance evaluation of a crystalline $Y_2O_3$ film as an insulation protecting film was performed. The evaluation was performed related to the withstand voltage test of a sample 3B as shown in FIGS. 15A and 15B. FIG. 15A is a plan view showing the sample 3B, and FIG. 15B is a sectional view seen from the arrow direction of a cutting plane line XV-XV of FIG. 15A.

An $Y_2O_3$ film 31B having a thickness of 400 nm was formed on a Ni substrate, which is the sample 3B, by using the sputtering technique. A Ta film (50 nm) as an adhering layer 33B, a W film (100 nm) as a diffusion preventing layer 34B, and an Au film 35B (500 nm) were similarly formed on the $Y_2O_3$ film 31B by the sputtering technique, and thin-film heaters 32B, which were severally shaped in a rectangular pad having an area of 4 $mm^2$, as shown in FIGS. 15A and 15B, were formed by the photolithographic technique.

The insulation withstand voltage evaluation of the insulation film, or the $Y_2O_3$ film, was performed by making measuring probes touch the Au film and the metal substrate, and by sweeping the voltage from 0 V to 40 V to trace the values of flowing currents. When the voltage was swept from 0 V, only minute leak currents of the order of pA or nA were able to be observed because the crystalline $Y_2O_3$ film, which was the insulation protecting film, was formed between the films. However, when the voltage grew to a magnitude at which insulation breakdown was caused, a conduction path was formed between the upper and lower films, and the leak current rapidly rose. The withstand voltage test compared the voltage values when the insulation breakdown was caused, and evaluated the performance of the insulation film.

Figure 16A:
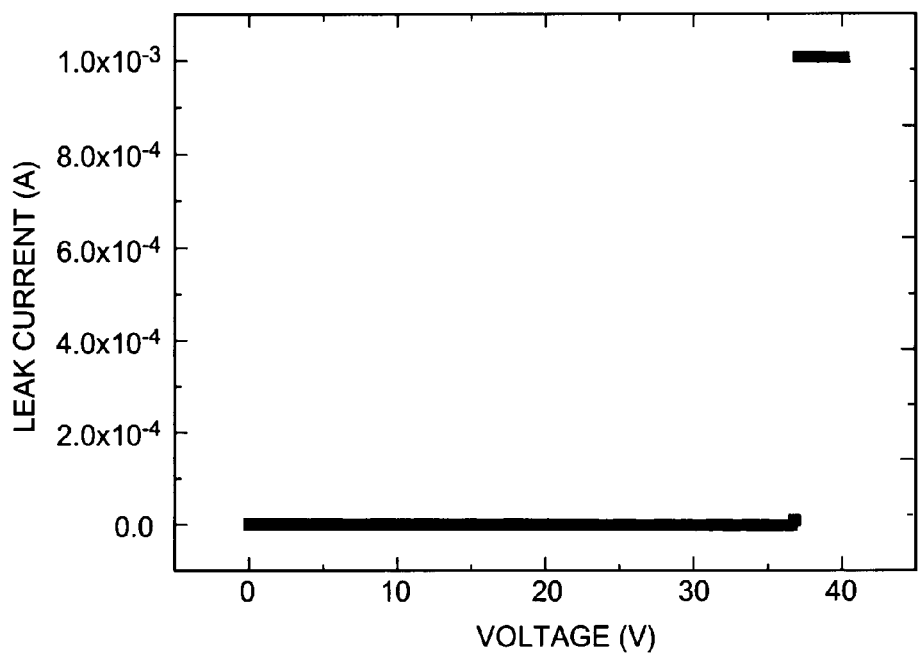
FIG. 16A is a diagram showing a withstand voltage evaluation result of a un-annealed $Y_2O_3$ film (film thickness: 400 nm)
Figure 16B:
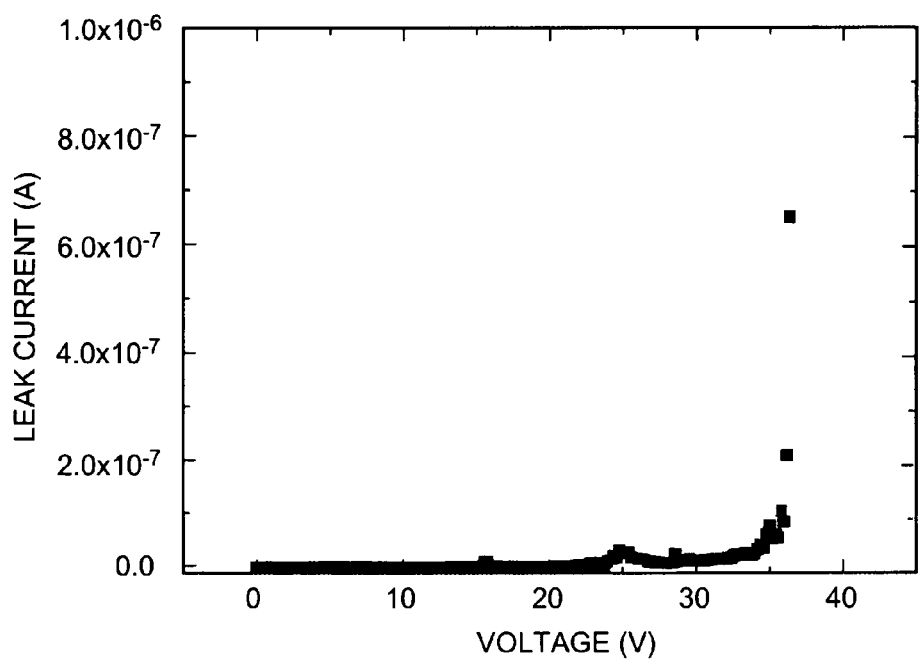
FIG. 16B is a diagram showing FIG. 16A the ordinate axis of which is enlarged.
Figure 17:
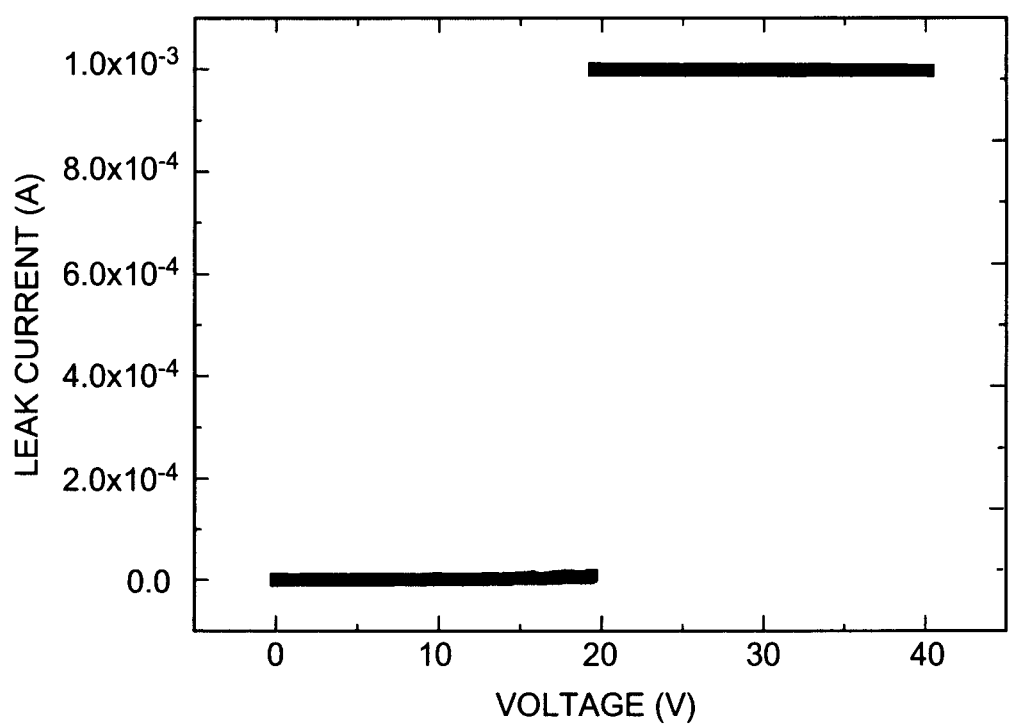
FIG. 17 is a diagram showing a withstand voltage evaluation result of a un-annealed $Y_2O_3$ film (film thickness: 200 nm)

FIGS. 16A and 16B are diagrams showing a withstand voltage evaluation result of a non-annealed $Y_2O_3$ film (having a film thickness of 400 nm), and FIG. 16B shows the data of FIG. 16A by enlarging the ordinate axis of FIG. 16A. As shown in FIGS. 16A and 16B, the withstand voltage can be estimated to be about 36 V. The leak current just before the insulation breakdown was about 80 nA, and the crystalline $Y_2O_3$ film was sufficiently performed the function of the electrical isolation. Consequently, the crystalline $Y_2O_3$ film can be considered that it sufficiently functions as the insulation film. In the above experiment example, the film thickness was set to 400 nm, and a result of the withstand voltage being 20 V was obtained in an experiment performed to the crystalline $Y_2O_3$ film having the film thickness of 200 nm (see FIG. 17). The result can be evaluated to bear comparison with the withstand voltage of a little under 40 V of a $SiO_2$ film (at the time of the film thickness of 200 nm). It can be estimated to be better in the withstand voltage at the time of the film thickness of 600 nm. The film thickness can be suitably set according to the use conditions of the film.

Moreover, if the insulation film is actually used as a micro reactor, the voltage is not applied between the upper and lower metals of the insulation film, but the voltage is applied at both the ends of the thin-film heater on the upper side of the insulation film on the upper surface to be used. Consequently, a voltage larger than the breakdown voltages estimated by the experiment examples at this time can be applied to the thin-film heater.

Figure 18A:
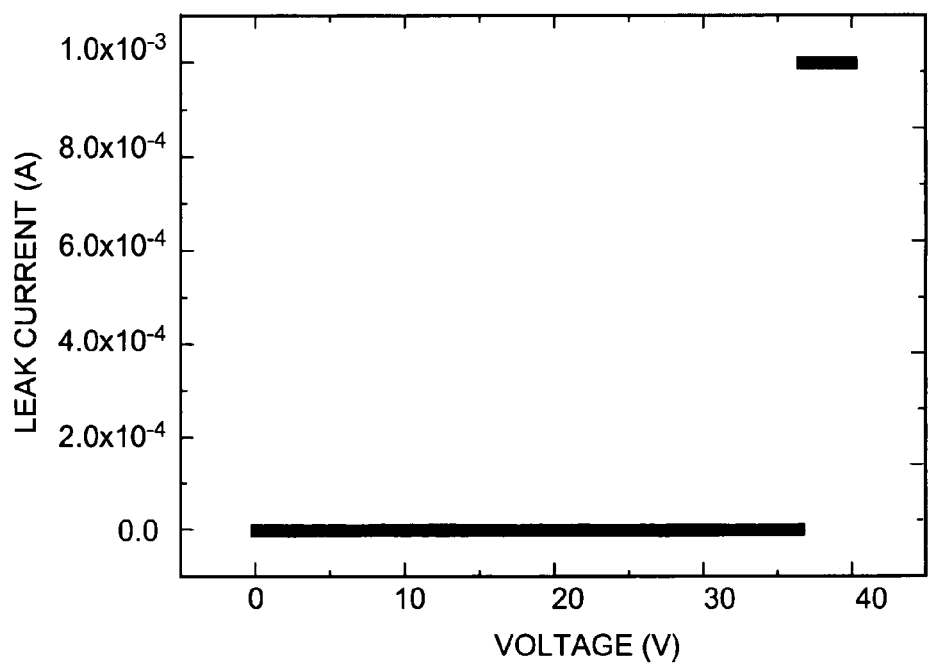
FIG. 18A is a diagram showing a withstand voltage evaluation result of a sample subjected to annealing treatment in an inert gas atmosphere to improve the crystallinity thereof.
Figure 18B:
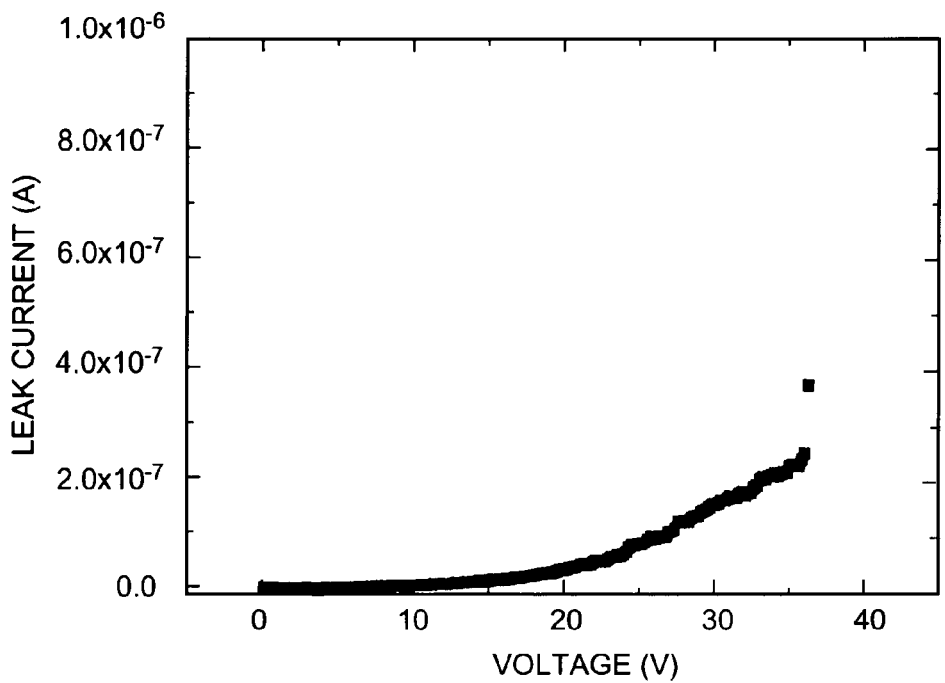
FIG. 18B is a is a diagram showing FIG. 18A the ordinate axis of which is enlarged.

FIGS. 18A and 18B are diagrams showing the withstand voltage evaluation result of a sample the crystallinity of which was improved by the annealing treatment at a temperature of 600° C. for 30 minutes in an inert gas atmosphere ($N_2$ gas here), and FIG. 18B shows the data of FIG. 18A by enlarging the ordinate axis of FIG. 18A. The sample subjected to the annealing treatment was observed to have the same degree of insulation breakdown voltage as that of the sample that was not processed by the annealing treatment, as it is known from FIGS. 18A and 18B, and the leak current of the sample was resulted to be 200 nA.

From the above experiments, the $Y_2O_3$ film having a crystal structure is apparently sufficient in the withstand voltage performance thereof, and the use of the $Y_2O_3$ film like this as an insulation film can be acknowledged to be very effective for the prevention of the peel-off and the cracks of the insulation film, which are easy to occur when the metal substrate is distorted.

Until now, $Y_2O_3$ has been described as an oxide that is easy to crystallize and has a sufficient withstand voltage. Because Y has characters resembling those of the other rare earth elements, it is expected that the other rare earth oxides ($R_2O_3$: R indicates a rare earth element) are hopeful materials (see FIG. 33).

SECOND EXAMPLE

Next, it will be described that a $Gd_2O_3$ film which is formed using Gd as the rare earth element R of the $R_2O_3$ film crystallizes, and that the $Gd_2O_3$ film is hard to perform insulation breakdown when a voltage is applied to the thin-film heater thereof.

<X-Ray Diffraction Measurement of $Gd_2O_3$ Film>

A $Gd_2O_3$ film (350 nm) was formed on a Ni substrate having a heat-oxidization film using a sputtering technique. The sputtering conditions were as follows: target material: $Gd_2O_3$; substrate temperature: 300° C.; ultimate pressure:

$5 \times 10^{-4}$ Pa; flow rate of process gas Ar+3% $O_2$: 50 sccm; sputtering pressure: 0.67 Pa; and sputtering power: 300 W.

Figure 19:
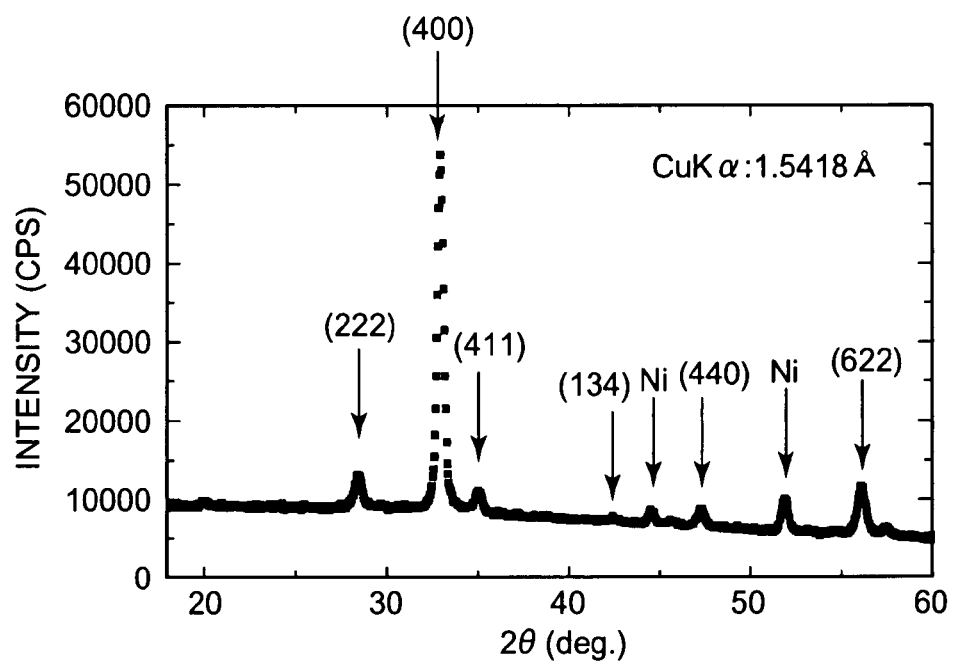
FIG. 19 is a diagram showing a result of the X-ray diffraction measurement of a $Gd_2O_3$ film immediately after film formation.

The $Gd_2O_3$ film was reported to have a C type structure (bixbyite structure) and a grating constant of 1.081 nm by the International Center for Diffraction Data (ICDD) cards. FIG. 19 is a diagram showing a result of X-ray diffraction measurement of the $Gd_2O_3$ film immediately after film formation. A comparatively sharp peak was observed differently from a wide peak structure peculiar to a material having an amorphous structure. The grating constant estimated from the result was 1.088 nm, and it can be understood that the $Gd_2O_3$ film has a crystal structure in which grating has somewhat extended (arrows in the drawing indicate that indexing was performed based on the bixbyite structure. Same as above).

Figure 20:
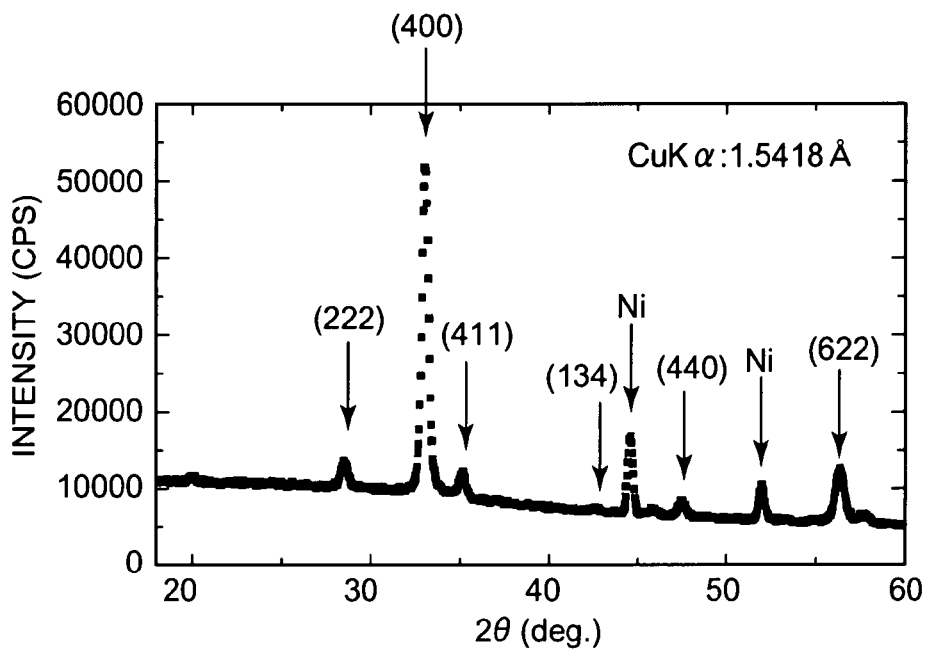
FIG. 20 is a diagram showing a result of the X-ray diffraction measurement of a $Gd_2O_3$ film annealed at a temperature of 800° C. for a holding time of 30 minutes in an argon atmosphere.

FIG. 20 is a diagram showing a result of X-ray diffraction measurement of a $Gd_2O_3$ film that was annealed at a temperature of 800° C. for 30 minutes of a holding time in an argon atmosphere. The anneal temperature was 800° C., and the holding time was 30 minutes. The annealed sample had sharper peaks in comparison with those of the film immediately after film formation, and the grating constant calculated based on the measured data was estimated to be 1.081 nm. It can be considered that the crystallinity of the film was further improved by an annealing effect and the grating constant agreed with the one written in the cards. It can be said that the $Gd_2O_3$ film has already had the crystallinity immediately after film formation and the crystallinity of the film can be more raised in the anneal process thereof.

Figure 21:
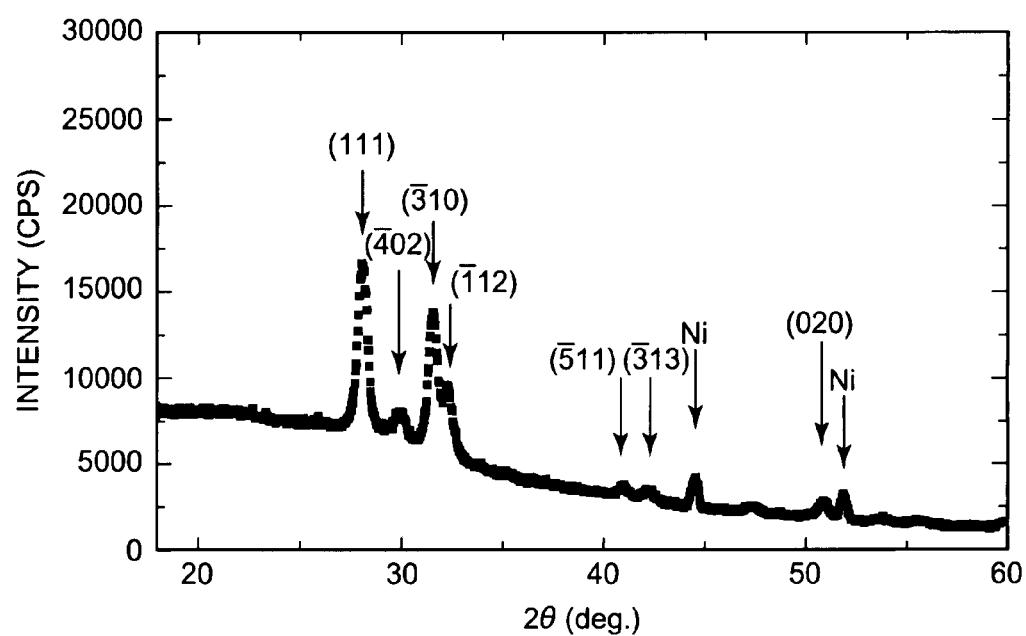
FIG. 21 is a diagram showing a result of the X-ray diffraction measurement of a $Gd_2O_3$ film at a room temperature after quenching the $Gd_2O_3$ film annealed at a temperature of 800° C. for a holding time of 30 minutes in an argon atmosphere.

Moreover, in case of the $Gd_2O_3$ film, a film having a B type crystal structure can be produced by quenching after annealing, or by changing the conditions of sputtering film formation. The B type film also has a linear expansion coefficient near to that of a metal like the C type film. FIG. 21 is a diagram showing a result of X-ray diffraction measurement of a $Gd_2O_3$ film at a room temperature after annealing the film at a temperature of 800° C. and quenching the annealed film after the annealing. (Here, the bars over numerals indicate negative directions when the coordinate axis is plotted by a notation used to distinguish the front surface of the grating surface from the back surface.

<Evaluation of Withstand Voltage of $Gd_2O_3$ Film>

Next, a performance evaluation of a crystalline $Gd_2O_3$ film as an insulation protecting film was performed. The evaluation was performed related to the withstand voltage test of a sample 3B as shown in FIGS. 15A and 15B similarly to the evaluation of the withstand voltage of the $Y_2O_3$ film.

A $Gd_2O_3$ film 31B having a thickness of 350 nm was formed on a Ni substrate, which is the sample 3B, by using the sputtering technique. A Ta film (50 nm) as an adhering layer 33B, a W film (100 nm) as a diffusion preventing layer 34B, and an Au film 35B (500 nm) were similarly formed on the $Gd_2O_3$ film 31B by the sputtering technique, and thin-film heaters 32B, which were severally shaped in a rectangular pad having an area of 4 mm², as shown in FIGS. 15A and 15B, were formed by the photolithographic technique.

The insulation withstand voltage evaluation of the insulation film, or the $Gd_2O_3$ film, was performed by making measuring probes touch the Au film and the metal substrate, and by sweeping the voltage from 0 V to 40 V to trace the values of flowing currents. When the voltage was swept from 0 V, only minute leak currents of the order of pA or nA were able to be observed because the crystalline $Gd_2O_3$ film, which was the insulation protecting film, was formed between the films. However, when the voltage grew to a magnitude at which insulation breakdown was caused, a conduction path was formed between the upper and lower films, and the leak current rapidly rose. The withstand voltage test compared the voltage values when the insulation breakdown was caused, and evaluated the performance of the insulation film.

Figure 22:
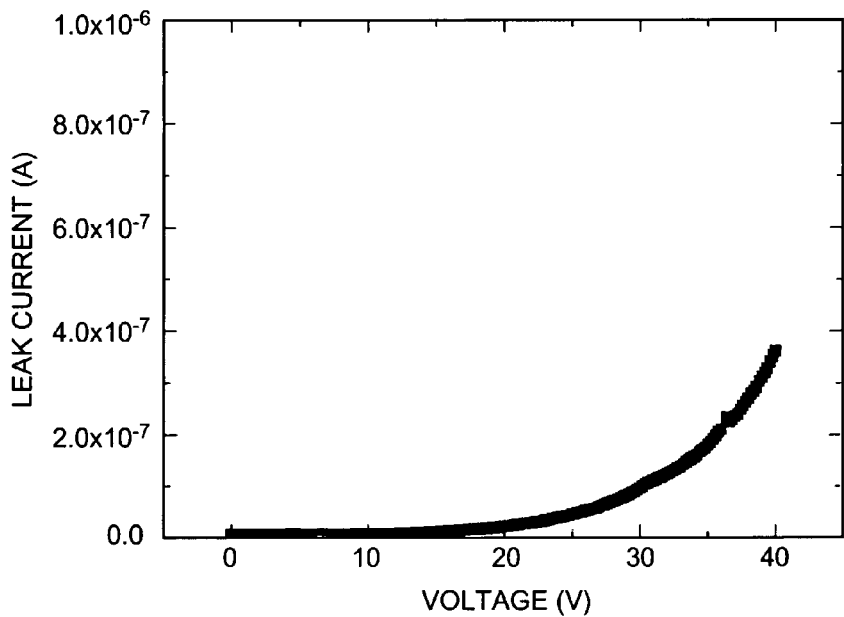
FIG. 22 is a diagram showing a withstand voltage evaluation result of a $Gd_2O_3$ film (film thickness: 350 nm) having a C type structure immediately after film formation.

FIG. 22 is a diagram showing a withstand voltage evaluation result of a $Gd_2O_3$ film (having a film thickness of 350 nm) of the C type structure immediately after film formation. As shown in FIG. 22, no insulation breakdown was observed in the measurement range. The leak current when the applied voltage was 40 V was about 350 nA to sufficiently perform the function of the electrical isolation, and the crystalline $Gd_2O_3$ film was able to be considered that it sufficiently functioned as the insulation film.

Figure 23:
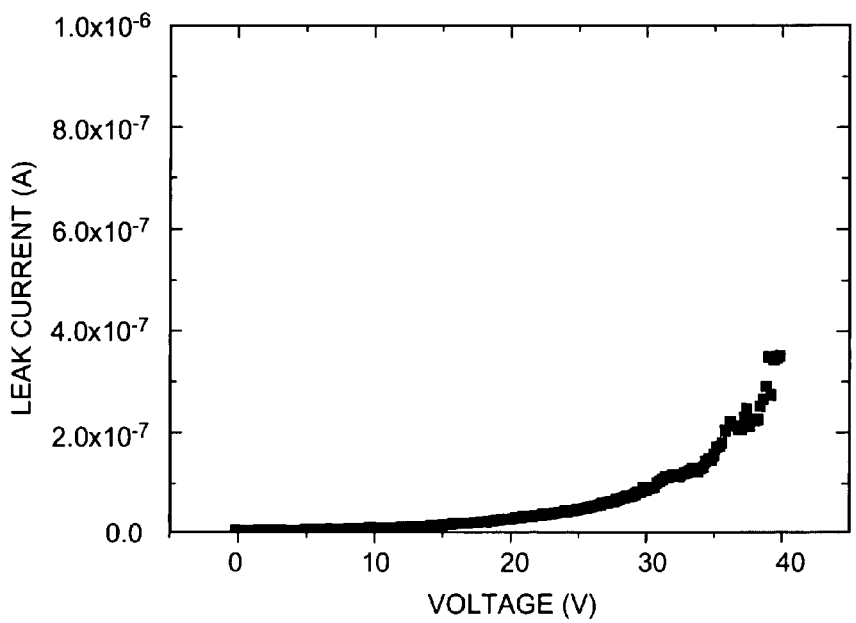
FIG. 23 is a diagram showing a withstand voltage evaluation result of a sample of a $Gd_2O_3$ film (film thickness: 350 nm) after film formation the crystallinity of which sample is improved by performing an annealing treatment thereof in an inert gas (argon gas here) atmosphere.

FIG. 23 is a diagram showing the withstand voltage evaluation result of a sample the crystallinity of which was improved by the annealing treatment at a temperature of 800° C. for 30 minutes in an inert gas atmosphere (argon gas here) after the film formation of a $Gd_2O_3$ film having the C type structure. No insulation breakdown was observed in the measurement range similarly to the result of the sample immediately after the film formation, and the leak current was also at the same degree as the former sample to be about 350 nA, as the results would be known from FIG. 23. Although the present experiment was performed at the film thickness of 350 nm, it can be expected that the withstand voltage would be further improved if the experiment is performed to the film having the film thickness of 600 nm. In the case where the film thickness is set to 200 nm, it can be expected that the breakdown voltage will exceed 20 V even in the worst case because the breakdown voltage is substantially proportionate to a film thickness and no insulation breakdown could be observed until 40 V in the sample having the film thickness of 350 nm in the present experiment. The film thickness is considered to be able to suitably set according to the use conditions of the film.

Figure 24:
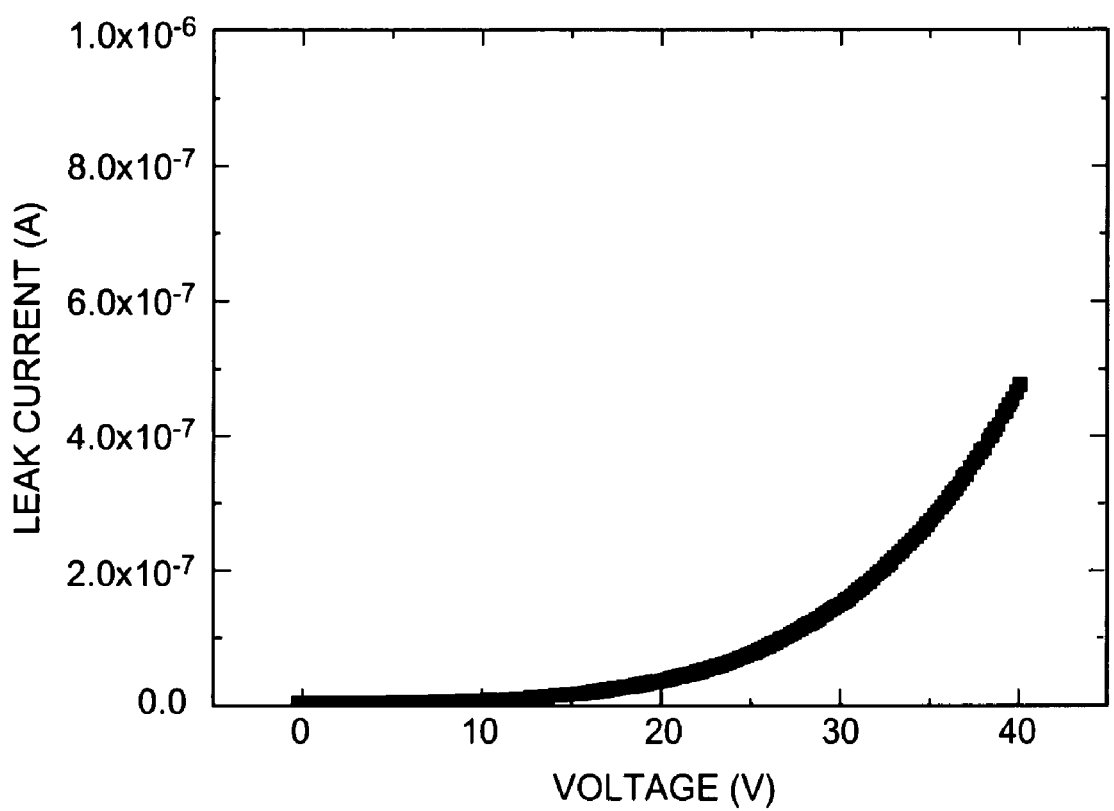
FIG. 24 is a diagram showing a withstand voltage measurement result of a $Gd_2O_3$ film having a B type structure which $Gd_2O_3$ film has been manufactured by quenching after annealing at 800° C. in an argon atmosphere.

Incidentally, FIGS. 22 and 23 show the results of the experiments of $Gd_2O_3$ film having the C type structure, and FIG. 24 is a diagram showing a withstand voltage measurement result of a $Gd_2O_3$ film having the B type structure, which was produced by annealing at the temperature of 800° C. in an argon atmosphere and by quenching after the annealing. No insulation breakdown was observed until 40 V in the film having the B type structure similarly to the film having the C type structure, and the B type film also has a sufficient insulation property.

Moreover, if the insulation film is actually used as a micro reactor, the voltage is not applied between the upper and lower metals of the insulation film, but the voltage is applied at both the ends of the thin-film heater on the upper side of the insulation film on the upper surface to be used. Consequently, a voltage larger than the breakdown voltages estimated by the experiment examples at this time can be applied to the thin-film heater.

From the above experiments, the $Gd_2O_3$ film having a crystal structure is apparently sufficient in the withstand voltage performance thereof, and the use of the $Gd_2O_3$ film like this as an insulation film can reduce the difference of the linear expansion coefficients between the metal substrate and the insulation film. It can be thereby acknowledged that the $Gd_2O_3$ film is very effective for the prevention of the peel-off and the cracks of the insulation film, which are easy to occur when the metal substrate is distorted in a high temperature environment.

The present invention uses a $Gd_2O_3$ film as the insulation film provided between a metal substrate and a wiring pattern made of a metal having electrical conductivity. If the $Gd_2O_3$ film is formed by the vapor deposition method, the sputtering method, the CVD method, the coating method, or the like, the film has a crystal structure called as the bixbyite structure.

Moreover, the degree of crystallization can be easily raised by a process such as anneal. The crystallized $Gd_2O_3$ film has a linear expansion coefficient of 10 ($\times 10^{-6}$/° C.), which is near to that of a metal, and consequently the crystallized $Gd_2O_3$ film is suitable for a metal-made miniaturized chemical reactor operating at a temperature higher than a room temperature.

THIRD EXAMPLE

Next, it will be described that a $Y_2O_3$ film formed by the first manufacturing method in the first embodiment crystallizes, and that forming a two-layer structure composed of a first $Y_2O_3$ film and a second $Y_2O_3$ film by the third manufacturing method in the second embodiment suppresses the warp of a metal substrate.
<X-Ray Diffraction Measurement>
An Y film (360 nm) was formed on a Si substrate having a heat-oxidization film using a sputtering technique. The sputtering conditions were as follows: target material: Y; ultimate pressure: $5\times10^{-4}$ Pa; flow rate of Ar gas: 20 sccm; sputtering pressure: 0.1 Pa; and sputtering power: 500 W. The Y film formed was annealed at a temperature of 350° C. for 15 minutes in an atmosphere of hydrogen gas (3%) and the residual weight of Ar gas to form an $YH_2$ film, and the X-ray diffraction measurement thereof was performed.

Figure 25:
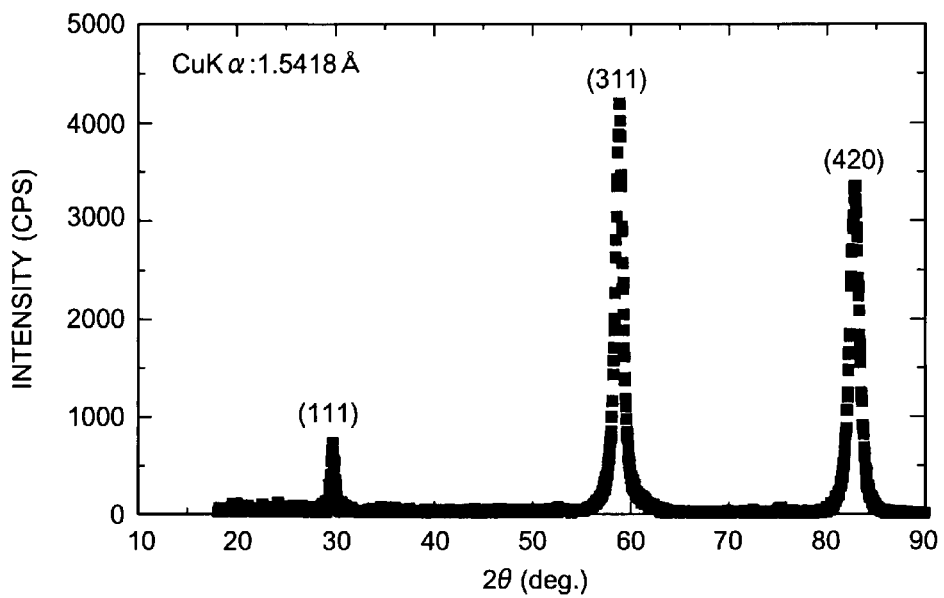
FIG. 25 is a diagram showing a result of the X-ray diffraction measurement of an $YH_2$ film immediately after film formation by the first manufacturing method.

The $YH_2$ film was reported to have a fluorite structure. FIG. 25 is a diagram showing a result of X-ray diffraction measurement of the $YH_2$ film immediately after film formation, and indexing is performed as the film having the fluorite structure. Although not observed diffraction peaks exist because the object is a thin film and is easily oriented, it can be understood that crystallized $YH_2$ film was produced. In particular, remarkable diffraction peaks were observed on the (111) surface, the (311) surface, and the (420) surface.

Figure 26:
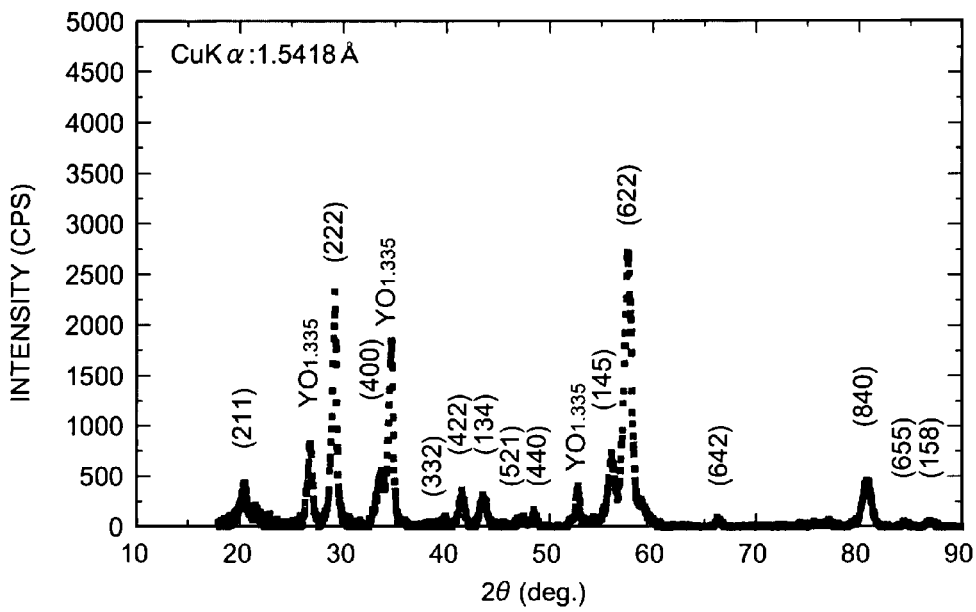
FIG. 26 is a diagram showing a result of the X-ray diffraction measurement of an $Y_2O_3$ film formed by annealing formed $YH_2$ film at 700° C. for 30 minutes in a vacuum.

FIG. 26 is a diagram showing a result of X-ray diffraction measurement of an $Y_2O_3$ film that was formed by being annealed at a temperature of 700° C. for 30 minutes in a vacuum atmosphere after the formation of the $YH_2$ film.

Figure 27:
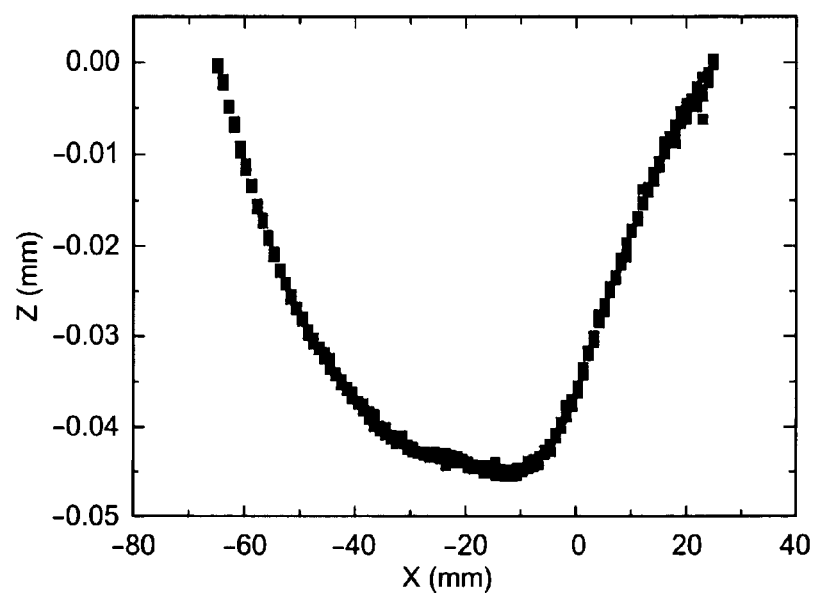
FIG. 27 is a diagram showing a result of the measurement of the warps of a substrate on which a one layer $Y_2O_3$ film is formed in a third example.

The $Y_2O_3$ film is a crystal having the bixbyite structure as mentioned above. The bixbyite structure is a structure deforming the fluorite structure, and indexing was similarly performed. It was reported that a period twice as long as that of the fluorite structure was taken as the unit lattice of the bixbyite structure. Consequently, the (111) surface, the (311) surface, and the (420) surface, which were remarkably observed in the $YH_2$ film, correspond to the (222) surface, the (622) surface, and the (840) surface, respectively. As shown in FIG. 26, the peak intensities of those surfaces are somewhat large, and it can be said that the $Y_2O_3$ film also has the orientation of the $YH_2$ film. Moreover, peaks corresponding to $YO_{1.335}$ were also observed besides the peaks of the $Y_2O_3$.
<Warp of Substrate>
Next, after an $Y_2O_3$ film (300 nm) was formed on a Ni substrate of four inches and 0.5 mm in thickness by the sputtering method, and the $Y_2O_3$ film was annealed at a temperature of 800° C. for 30 minutes in an Ar atmosphere. The warp of the substrate that was produced by the film formation was measured. The measurement result is shown in FIG. 27. As shown in FIG. 27, the warp of the substrate was convex downward by 45 μm.

Figure 28:
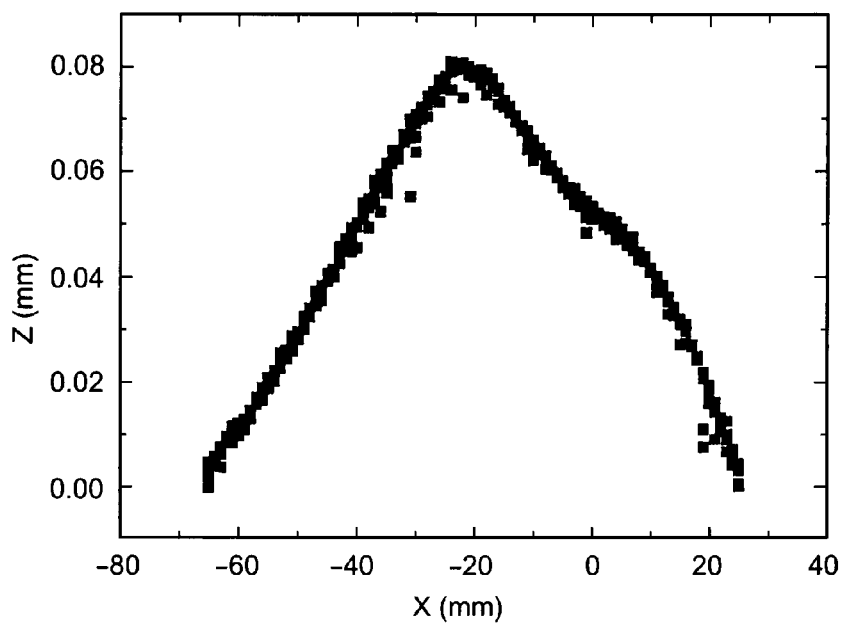
FIG. 28 is a diagram showing a result of the measurement of the warps of a substrate on which a two-layer $Y_2O_3$ film is formed in the third example.

After an Y film (200 nm) was formed by the sputtering method on the $Y_2O_3$ film formed on the Ni substrate, the temperature was raised to 350° C. for 15 minutes in an atmosphere of Ar and 3% hydrogen gas, and the substrate was held for 15 minutes to form an $YH_2$ film. Furthermore, the temperature was raised to 700° C. for 70 minutes in a vacuum atmosphere ($10^{-3}$ Pa to $10^{-4}$ Pa), and the substrate was held for 30 minutes to form an $Y_2O_3$ film. The warp of this substrate was measured, and the measurement result is shown in FIG. 28. As shown in FIG. 28, the warp of the substrate was convex upward by 80 μm. It can be known that the warp, which was convex downward in the substrate including only one layer of $Y_2O_3$ film, was able to be reversely convex upward by the formation of the $Y_2O_3$ film to be two-layer structure as mentioned above. Incidentally, it is expected that the reverse warp to be convex upward can be suppressed by forming the Y film to be further thinner.

FOURTH EXAMPLE

Figure 29:
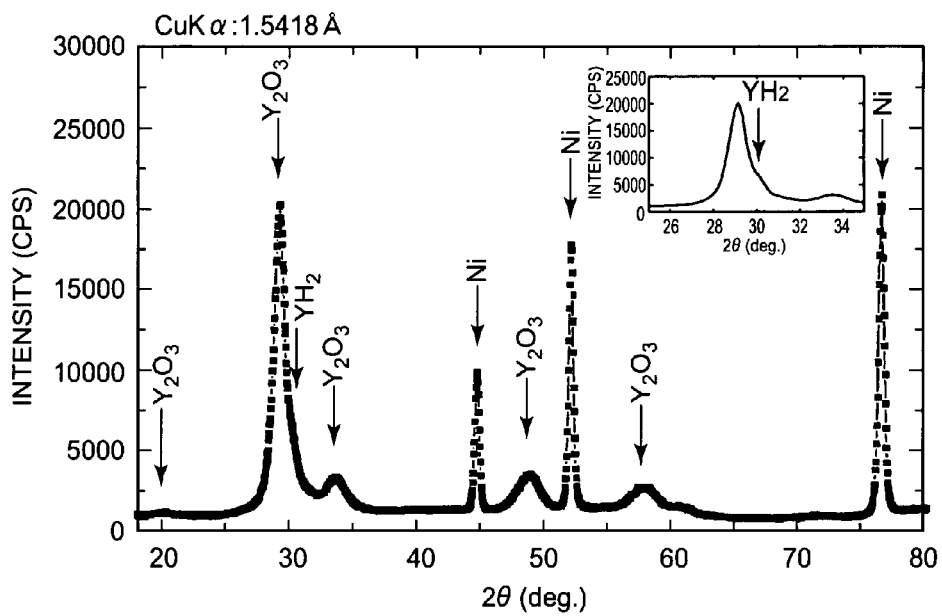
FIG. 29 is a diagram showing a result of the X-ray diffraction measurement of a sample immediately after film formation by a fourth manufacturing method in a fourth example.

Next, it will be described in the following that the $Y_2O_3$ film formed by the fourth manufacturing method in the first embodiment crystallizes.
<X-Ray Diffraction Measurement>
Film formation using a hydrogen containing Y ingot as a vapor deposition source was performed on a Ni substrate by the vapor deposition method. The conditions of the vapor deposition were to use the Y ingot annealed at a temperature in a range of 300° C. to 400° C. for one hour in an atmosphere containing hydrogen gas less than 4% by weight, which is an explosion limit, and the rest weight of an inert gas (Ar, Ne, or $N_2$ gas), if the Y of the vapor deposition source does not contain hydrogen, and the following: substrate temperature: 280° C.; degree of vacuum at the time of film formation: 3-5 ($\times10^{-3}$ Pa); and film formation speed: 18 nm/min. Then, the X-ray diffraction measurement of an obtained sample was performed. FIG. 29 is a diagram showing a result of the X-ray diffraction measurement of the sample immediately after the film formation (the inserted diagram on the upper right corner is an enlarged view of the main diagram where 2θ is in the range of 25° to 35°). The diffraction patterns of $YH_2$ having the fluorite structure, $Y_2O_3$ having the bixbyite structure, and Ni of the substrate were observed. As described above, it can be understood that a film containing $YH_2$ was formed owing to the influence of infinitesimal hydrogen atom contained in the ingot of Y, which was the vapor deposition source. Moreover, it can be understood that from the fact that the diffraction pattern of Y was not observed and the diffraction pattern of $Y_2O_3$ was observed, the infinitesimal oxygen in the film had been already taken in owing to the influence of the hydrogen at the time of film formation.

Figure 30:
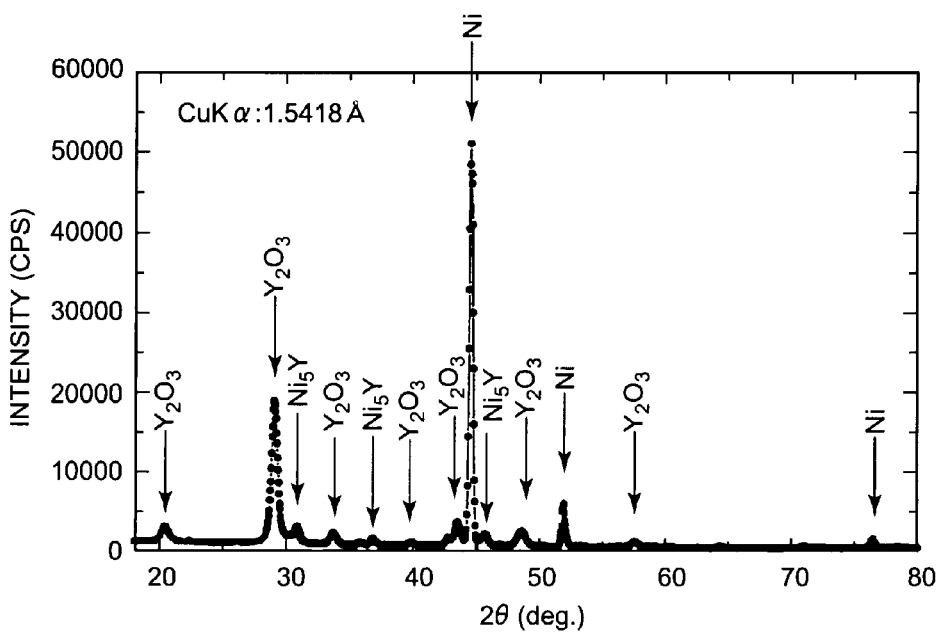
FIG. 30 is a diagram showing a result of the X-ray diffraction measurement of the sample of FIG. 29 in the fourth example, in a case where the sample is annealed.
Figure 31A:
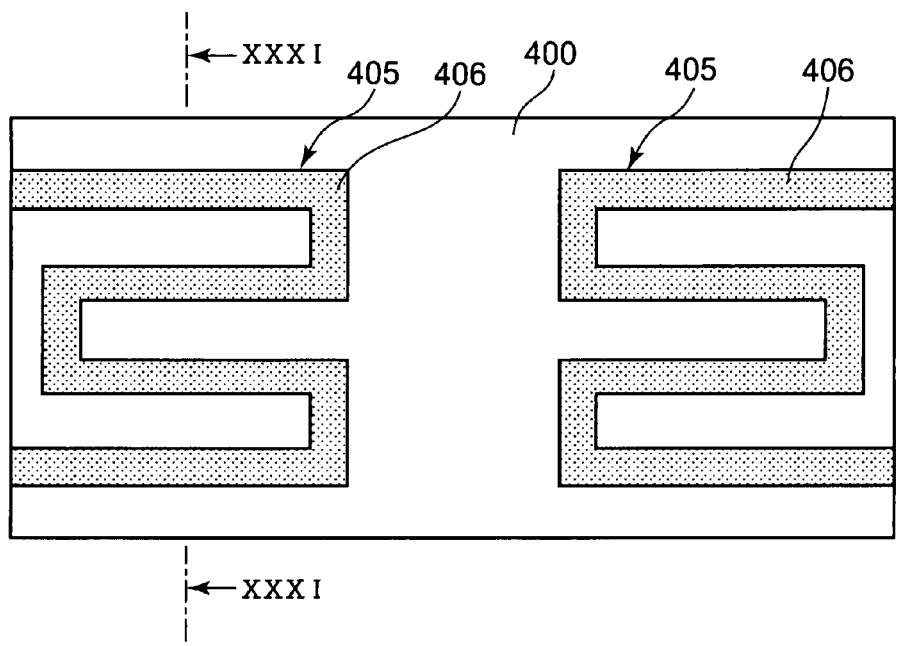
FIG. 31A is a plan view showing the substrate 400 that is a glass substrate.
Figure 31B:
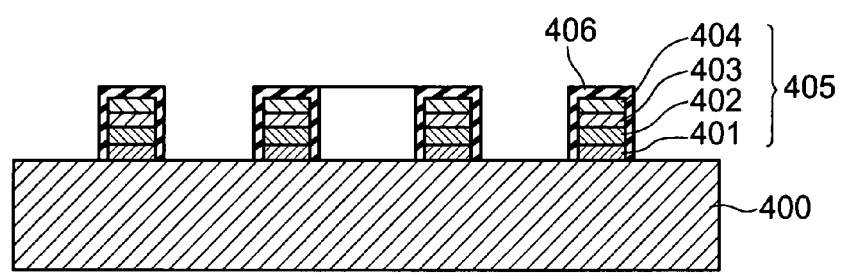
FIG. 31B is a sectional view seen from the arrow direction of a cutting plane line XXXI-XXXI of FIG. 31A.

FIG. 30 is a diagram showing a result of X ray diffraction measurement of a sample of FIG. 29 that was annealed at 700° C. in a vacuum ($1\times10^{-4}$ Pa) atmosphere. As shown in FIG. 30, the diffraction pattern of $Ni_5Y$ owing to the diffusion of Y and Ni on the interface between the film and the substrate was observed in addition to the diffraction patterns of $Y_2O_3$ and Ni. The diffraction patter of $YH_2$, which was observed in the diagram of FIG. 29, was not observed, and consequently it can be said that the formed film was clean film from which hydrogen was disconnected. Moreover, the diffraction peak of $Y_2O_3$ has a narrower half-value width in comparison with that of FIG. 17, it can be understood that the crystallite size became larger. Because Y is a material to be easily oxidized, Y is difficult to handle. But if the object material is oxide, the handling does not preferably matter.

In the above, $Y_2O_3$ and $Gd_2O_3$ as the oxides that are easy to crystallize and severally have a good withstand voltage have been described in the present invention. Because Y and Gd have characteristics resembling the other rare earth elements, it is expected that the other rare earth oxides ($R_2O_3$: R indicates a rare earth element) are also hopeful materials (see FIG. 33).

Any $R_2O_3$ has a linear expansion coefficient within a range of 7 to 10 ($\times 10^{-6}$/° C.), which is near to that of a metal.

FIG. 34 is a diagram showing the melting points and the types of crystal structures of rare earth oxides ($R_2O_3$: R indicates a rare earth element). As apparent from FIG. 34, the rare earth oxides have sufficiently high melting points, and consequently the rare earth oxides can bear in a high temperature environment.

As described above, it is expected that the other rare earth oxides ($R_2O_3$: R indicates a rare earth element) are easy to crystallize and severally have a good withstand voltage as an interlayer insulation film formed on a metal substrate besides an $Y_2O_3$ film and a $Gd_2O_3$ film. However, the rare earth oxides having the good withstand voltage are somewhat limited between the two characteristics, and the reason why the $Y_2O_3$ and the $Gd_2O_3$ have good insulation properties is that the oxides of Y are only sesquioxides (except for under extremely special condition) and the oxides of Y having the other compositions do not exist (or hard to exist).

If the other oxides exist, for example, in the case of oxides of Eu, there are EuO and $Eu_2O_3$. EuO is a semiconductor, and $Eu_2O_3$ is an insulating material. The former is $Eu^{2+}$, and the latter is $Eu^{3+}$. If there are two kinds or more oxides, $E_2O_3$ includes not only $Eu^{3+}$, but also $Eu^{2+}$. Consequently, $E_2O_3$ has oxygen deficiency, and is easy to be $E_2O_{3-X}$. The oxygen deficiency like this, i.e. the state in which different valences are mixed, causes the lowering of the withstand voltage or electric (or ionic) conducting property.

Consequently, the materials suitable for an insulation film are the oxides having only sesquioxides ($R_2O_3$), which are typical oxides. Hence, the insulation films are limited to $Sc_2O_3$, $Y_2O_3$, $La_2O_3$, $Gd_2O_3$, $Dy_2O_3$, $Ho_2O_3$, $Er_2O_3$, $Tm_2O_3$, and $Lu_2O_3$. Because the oxides composed of the rare earth elements other than those mentioned above can severally take a plurality of oxides such as RO and $RO_2$ and their crystal structures change according to their operating temperature ranges, the oxides are excluded.

Moreover, because the rare earth elements have chemical characters resembling each other very closely and a characteristic to be a solid solution easily, $R_2O_3$ may be include two of more of Sc, Y, La, Gd, Dy, Ho, Er, Tm, and Lu.

The rare earth oxides can be classified into three types of a A type (hexagonal crystals), a B type (monoclinic crystals), and a C type (cubic crystals, bixbyite structure) based on their crystal structures, and the $Y_2O_3$, which has been described above, corresponds to the C type (bixbyite structure) at a room temperature. The C type (bixbyite structure) among the three kinds of crystal structures has a wider stable region in comparison with those of the A type (hexagonal crystal) and the B type (monoclinic crystal), $Sc_2O_3$, $Y_2O_3$, $Gd_2O_3$, $Dy_2O_3$, $Ho_2O_3$, $Er_2O_3$, $Tm_2O_3$, and $Lu_2O_3$ having the C type crystal structure can easily manufacture a film having a crystal structure, and they can be said to be the optimum to the present invention.

Incidentally, as described above, because the $Gd_2O_3$ can produce a film having the B type crystal structure by quenching the $Gd_2O_3$ after film annealing or by changing the conditions of sputtering film formation, and the linear expansion coefficient of the B type film is also near to that of a metal like that of the C type film. Consequently, the $Gd_2O_3$ can be said to be suitably used.

The entire disclosures of Japanese Patent Applications No. 2006-233849 filed on Aug. 30, 2006, No. 2006-267832 filed on Sep. 29, 2006, and No. 2007-133587 filed on May 21, 2007 including their descriptions, their claims, their drawings, and their summaries are incorporated herein by reference in their entireties.

Although various exemplary embodiments have been shown and described, the invention is not limited to the embodiments shown. Therefore, the scope of the invention is intended to be limited solely by the scope of the claims that follow.

What is claimed is:

1. A method of manufacturing an electrical insulation film, comprising:
    forming an R film containing at least one rare earth element R selected from the group consisting of Sc, Y, La, Gd, Dy, Ho, Er, Tm, and Lu on at least a portion of a surface of a metal substrate where an electrical insulation property is needed;
    hydrogenating the R film under an inert gas atmosphere, which contains a hydrogen gas, to form an $RH_2$ film; and
    dehydrogenating the $RH_2$ film by annealing the $RH_2$ film under a vacuum atmosphere, and further oxidizing the dehydrogenated $RH_2$ film by taking in an oxygen atom in replacement of a hydrogen atom, to form an $R_2O_3$ film.

2. The method according to claim 1, wherein the dehydrogenating and the oxidizing are performed by annealing the $RH_2$ film under the vacuum atmosphere of not more than $1 \times 10^{-4}$ Pa, within a range of 300° C. to 800° C. for 30 minutes.

3. A method of manufacturing an electrical insulation film, comprising:
    depositing a vapor deposition source to at least a portion of a surface of a metal substrate where an electrical insulation property is needed, the vapor deposition source including a hydrogen atom and at least one rare earth element R selected from the group consisting of Sc, Y, La, Gd, Dy, Ho, Er, Tm, and Lu, to form an R film on the surface of the metal substrate, followed by forming an $RH_2$ film on the R film and forming an $R_2O_3$ film on the $RH_2$ film; and
    dehydrogenating the $RH_2$ film by annealing the $RH_2$ film under a vacuum atmosphere, and further oxidizing the dehydrogenated $RH_2$ film by taking in an oxygen atom in replacement of a hydrogen atom, to form the oxidized $R_2O_3$ film.

4. The method according to claim 3, wherein the dehydrating and the oxidizing are performed by annealing the $RH_2$ film the under the vacuum atmosphere of not more than $1 \times 10^{-4}$ Pa, within a range of 300° C. to 800° C. for 30 minutes.

5. A method of manufacturing an electrical insulation film, comprising:
    forming a first $R_2O_3$ film containing at least one rare earth element R selected from the group consisting of Sc, Y, La, Gd, Dy, Ho, Er, Tm, and Lu on at least a portion of a surface of a metal substrate where an electrical insulation property is needed; and
    forming a second $R_2O_3$ film, wherein forming the second $R_2O_3$ film includes:
    forming an R film containing at least one rare earth element R selected from the group consisting of Sc, Y, La, Gd, Dy, Ho, Er, Tm, and Lu on the first $R_2O_3$ film,
    hydrogenating the R film under an inert gas atmosphere, which contains a hydrogen gas, to form an $RH_2$ film, and
    dehydrogenating the $RH_2$ film by annealing the $RH_2$ film under a vacuum atmosphere, and further oxidizing the dehydrogenated $RH_2$ film by taking in an oxygen atom in replacement of a hydrogen atom, to form the oxidized $R_2O_3$ film.

6. A method of manufacturing an electrical insulation film, comprising:
   forming a first $R_2O_3$ film, wherein forming the first $R_2O_3$ film includes:
   forming an R film containing at least one rare earth element R selected from the group consisting of Sc, Y, La, Gd, Dy, Ho, Er, Tm, and Lu on at least a portion of a surface of a metal substrate where an electrical insulation property is needed,
   hydrogenating the R film under an inert gas atmosphere, which contains a gas including a hydrogen atom, to form an $RH_2$ film, and
   dehydrogenating the $RH_2$ film by annealing the $RH_2$ film under a vacuum atmosphere, and further oxidizing the dehydrogenated $RH_2$ film by taking in an oxygen atom in replacement of the hydrogen atom, to form the oxidized first $R_2O_3$ film; and
   forming a second $R_2O_3$ film containing at least one rare earth element R selected from the group consisting of Sc, Y, La, Gd, Dy, Ho, Er, Tm, and Lu on the first $R_2O_3$ film.

7. A method of manufacturing an electrical insulation film, comprising:
   forming a first $R_2O_3$ film containing at least one rare earth element R selected from the group consisting of Sc, Y, La, Gd, Dy, Ho, Er, Tm, and Lu on at least a portion of a surface of a metal substrate where an electrical insulation property is needed; and
   forming a second $R_2O_3$ film, wherein forming the second $R_2O_3$ film includes:
   depositing a vapor deposition source to at least a portion of a surface of a metal substrate where an electrical insulation property is needed, the vapor deposition source including a hydrogen atom and at least one rare earth element R selected from the group consisting of Sc, Y, La, Gd, Dy, Ho, Er, Tm, and Lu, to form an R film on the surface of the metal substrate, followed by forming an $RH_2$ film on the R film and forming the second $R_2O_3$ film on the $RH_2$ film; and
   dehydrogenating the $RH_2$ film by annealing the $RH_2$ film under a vacuum atmosphere, and further oxidizing the dehydrogenated $RH_2$ film by taking in an oxygen atom in replacement of the hydrogen atom, to form the oxidized second $R_2O_3$ film.

8. A method of manufacturing an electrical insulation film, comprising:
   forming a first $R_2O_3$ film, wherein forming the first $R_2O_3$ film includes:
   depositing a vapor deposition source to at least a portion of a surface of a metal substrate where an electrical insulation property is needed, the vapor deposition source including a hydrogen atom and at least one rare earth element R selected from the group consisting of Sc, Y, La, Gd, Dy, Ho, Er, Tm, and Lu, to form an R film on the surface of the metal substrate, followed by forming an $RH_2$ film on the R film and forming the first $R_2O_3$ film on the $RH_2$ film; and
   dehydrogenating the $RH_2$ film by annealing the $RH_2$ film under a vacuum atmosphere, and further oxidizing the dehydrogenated $RH_2$ film by taking in an oxygen atom in replacement of the hydrogen atom, to form the oxidized first $R_2O_3$ film; and
   forming a second $R_2O_3$ film containing at least one rare earth element R selected from the group consisting of Sc, Y, La, Gd, Dy, Ho, Er, Tm, and Lu on the first $R_2O_3$ film.

* * * * *